United States Patent
Williams

(10) Patent No.: US 6,725,769 B1
(45) Date of Patent: Apr. 27, 2004

(54) METHOD AND APPARATUS FOR APPLYING A VISCOUS OR PASTE MATERIAL ONTO A SUBSTRATE

(75) Inventor: David Godfrey Williams, Hoylake (GB)

(73) Assignee: Dek International GmbH, Zurich (CH)

(*) Notice: Subject to any disclaimer, the term of this patent is extended or adjusted under 35 U.S.C. 154(b) by 0 days.

(21) Appl. No.: 09/763,630

(22) PCT Filed: Sep. 6, 1999

(86) PCT No.: PCT/GB99/02953

§ 371 (c)(1),
(2), (4) Date: Mar. 7, 2001

(87) PCT Pub. No.: WO00/15436

PCT Pub. Date: Mar. 23, 2000

(30) Foreign Application Priority Data

| Sep. 10, 1998 | (GB) | 9819625 |
| Nov. 18, 1998 | (GB) | 9825158 |
| Dec. 18, 1998 | (GB) | 9827763 |
| Feb. 12, 1999 | (GB) | 9903146 |

(51) Int. Cl.[7] ............................................... B41F 15/44
(52) U.S. Cl. ........................................ 101/123; 118/413
(58) Field of Search ........................... 101/114, 123, 101/124, 129, 366; 118/406, 410, 413

(56) References Cited

U.S. PATENT DOCUMENTS

| 4,023,486 A | | 5/1977 | Linthicum et al. |
| 4,043,683 A | | 8/1977 | Costa et al. |
| 4,541,395 A | * | 9/1985 | Geiger ......................... 123/514 |
| 4,622,239 A | | 11/1986 | Schoenthaler |
| 4,961,955 A | * | 10/1990 | Goldberg ..................... 427/560 |
| 5,284,189 A | | 2/1994 | Best |
| 5,524,537 A | * | 6/1996 | van der Meulen .......... 101/120 |
| 5,947,022 A | * | 9/1999 | Freeman et al. ............. 101/123 |
| 6,158,338 A | * | 12/2000 | MacRaild et al. ........... 101/123 |
| 6,171,399 B1 | * | 1/2001 | Kaiser et al. ................ 118/406 |
| 6,286,422 B1 | * | 9/2001 | Lin et al. ..................... 101/123 |

FOREIGN PATENT DOCUMENTS

| GB | 1433957 | 4/1976 |
| GB | 1586282 | 3/1981 |
| WO | 96/20088 | 7/1996 |
| WO | 98/16387 | 4/1998 |

* cited by examiner

Primary Examiner—Ren Yan
(74) Attorney, Agent, or Firm—Dennison, Schultz, Dougherty & MacDonald

(57) ABSTRACT

An application device for applying viscous or paste fluid material to a surface therebeneath and having a fluid outlet aperture in its lower region and including a sealing gasket or foil for sealing the outlet aperture against the surface. The gasket or foil is formed from a sheet of flexible material with an uninterrupted or continuous, non-apertured outer part extending around the periphery of the outlet aperture and surrounding an inner aperture or apertured inner region of the gasket or foil.

31 Claims, 25 Drawing Sheets

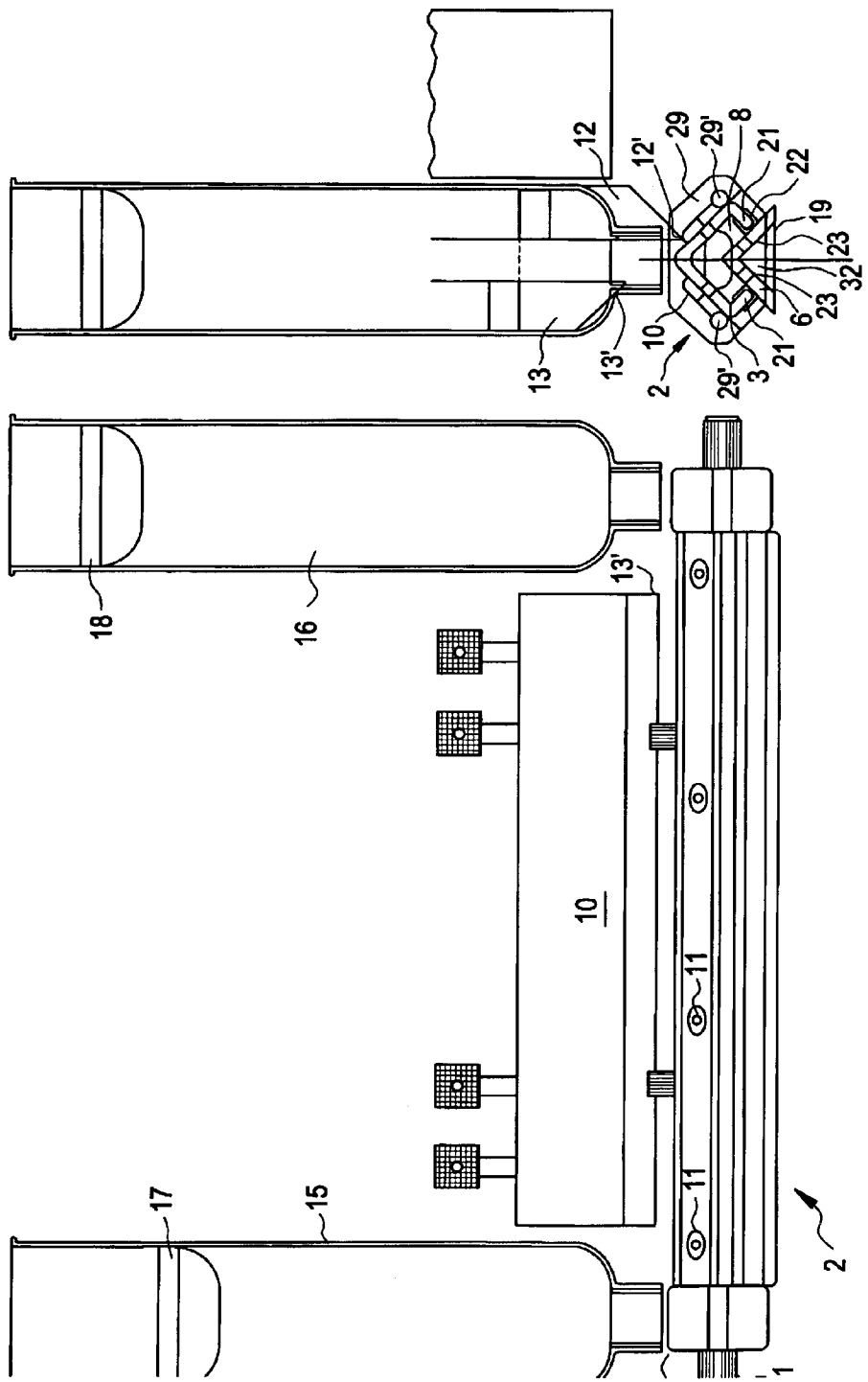

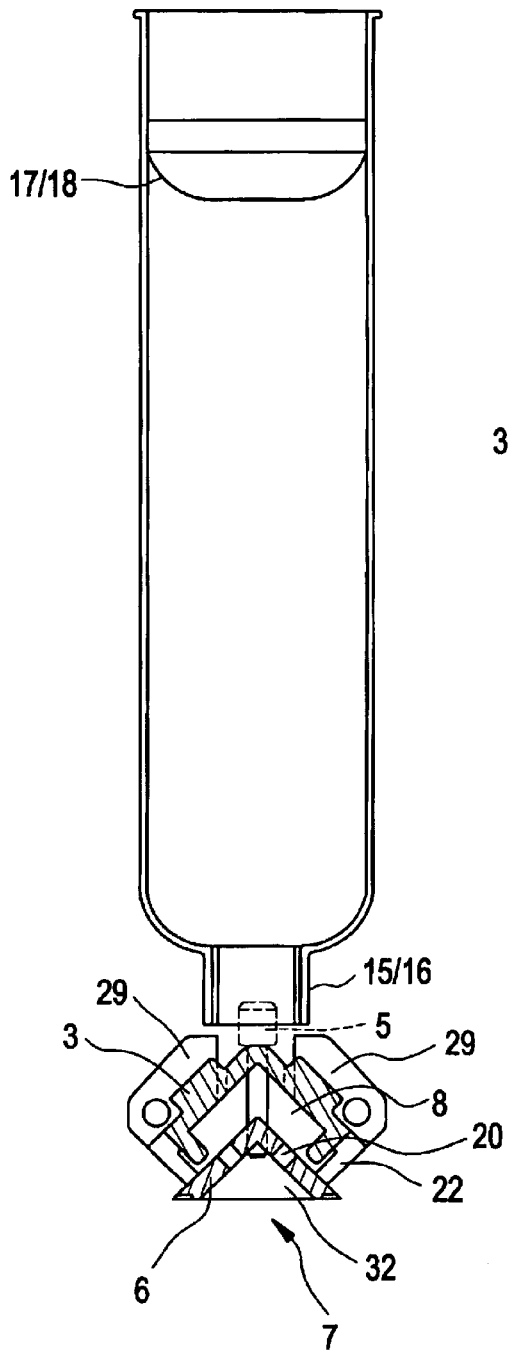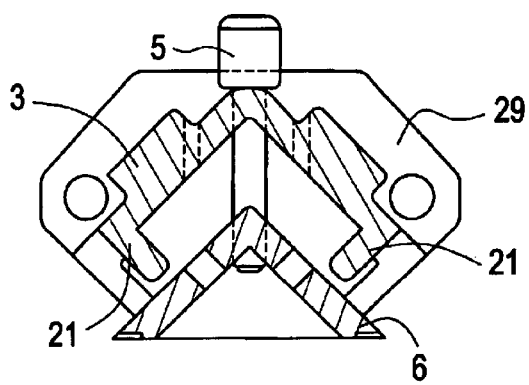

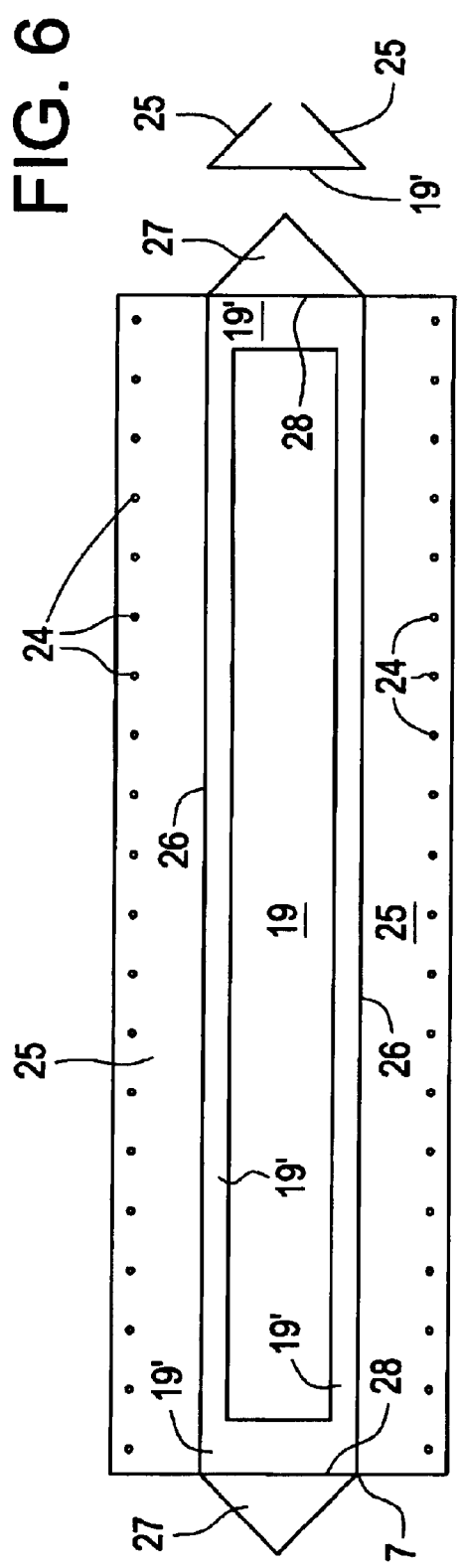

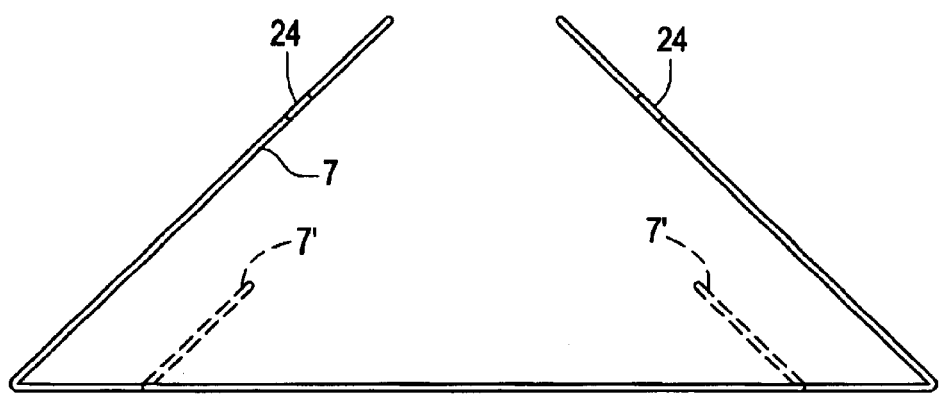
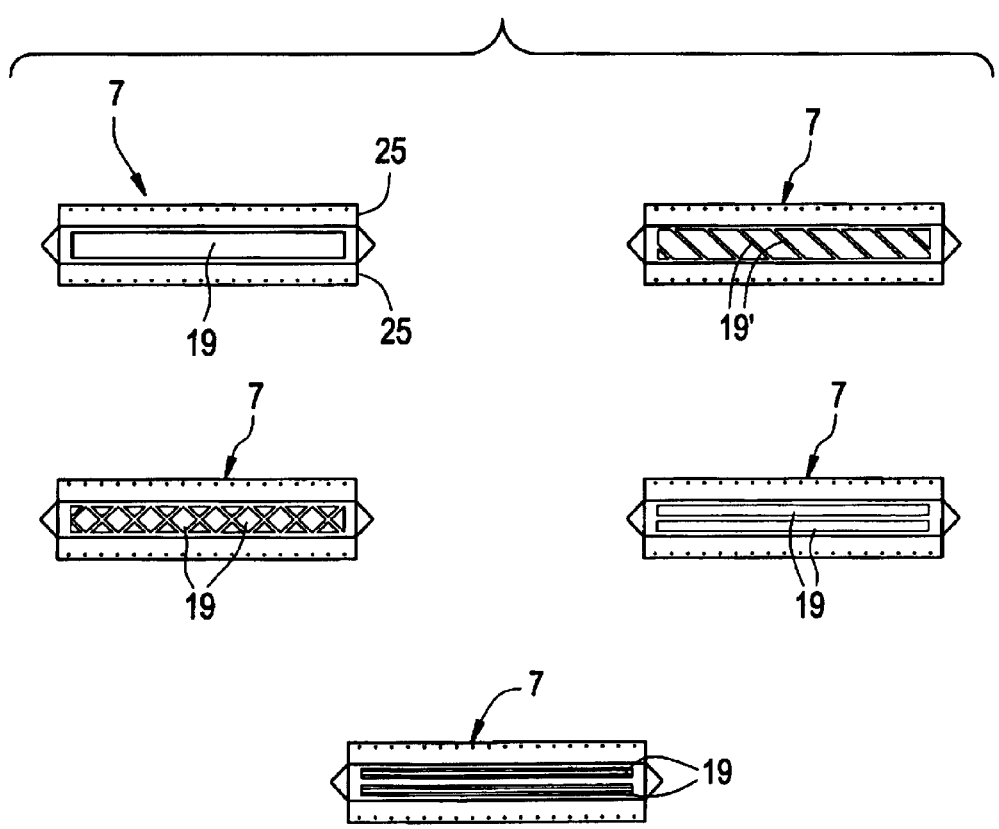

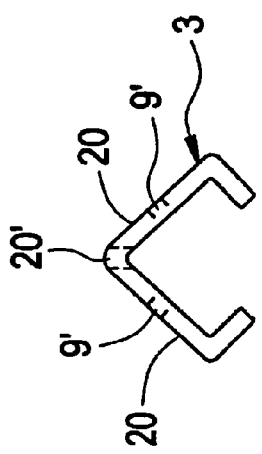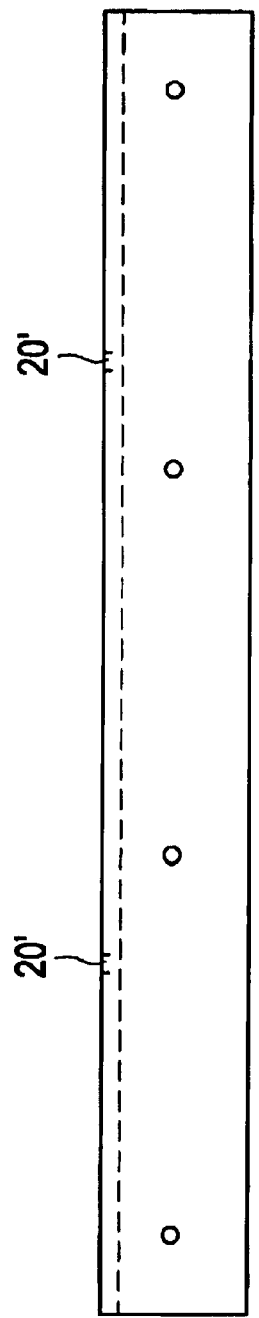

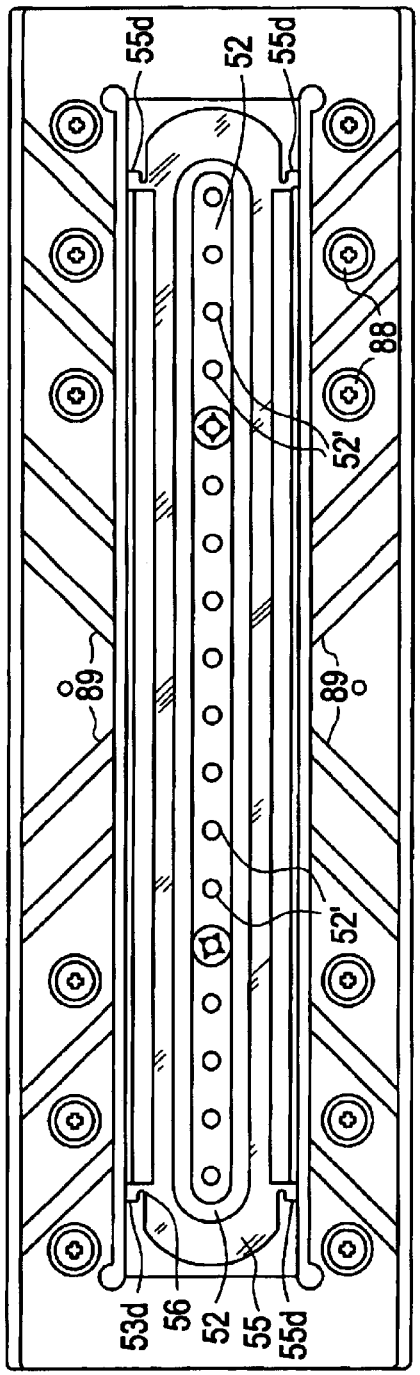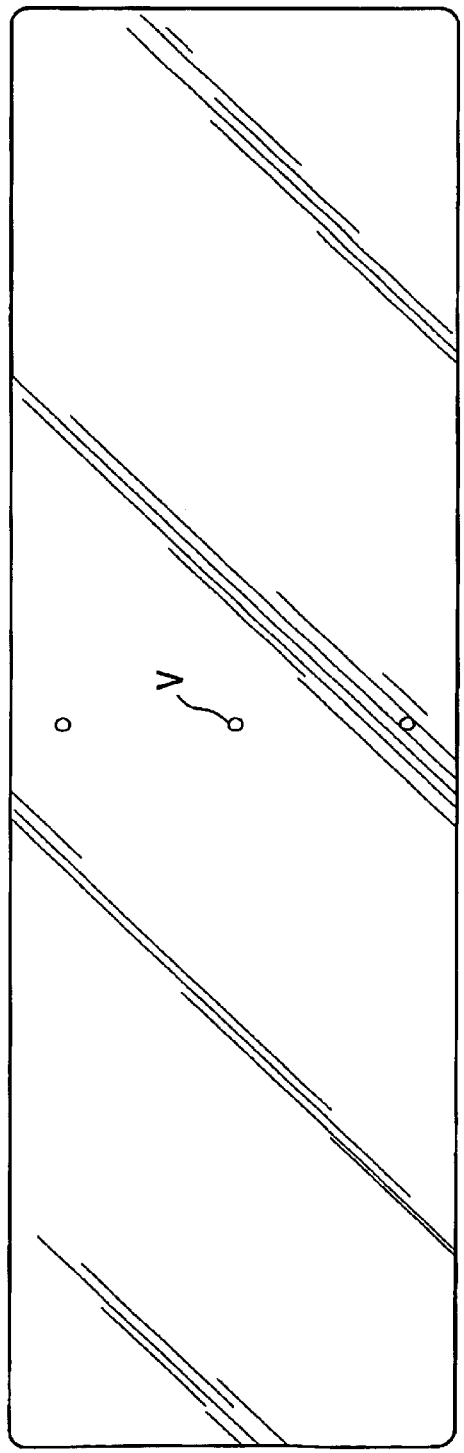
FIG. 22
FIG. 23

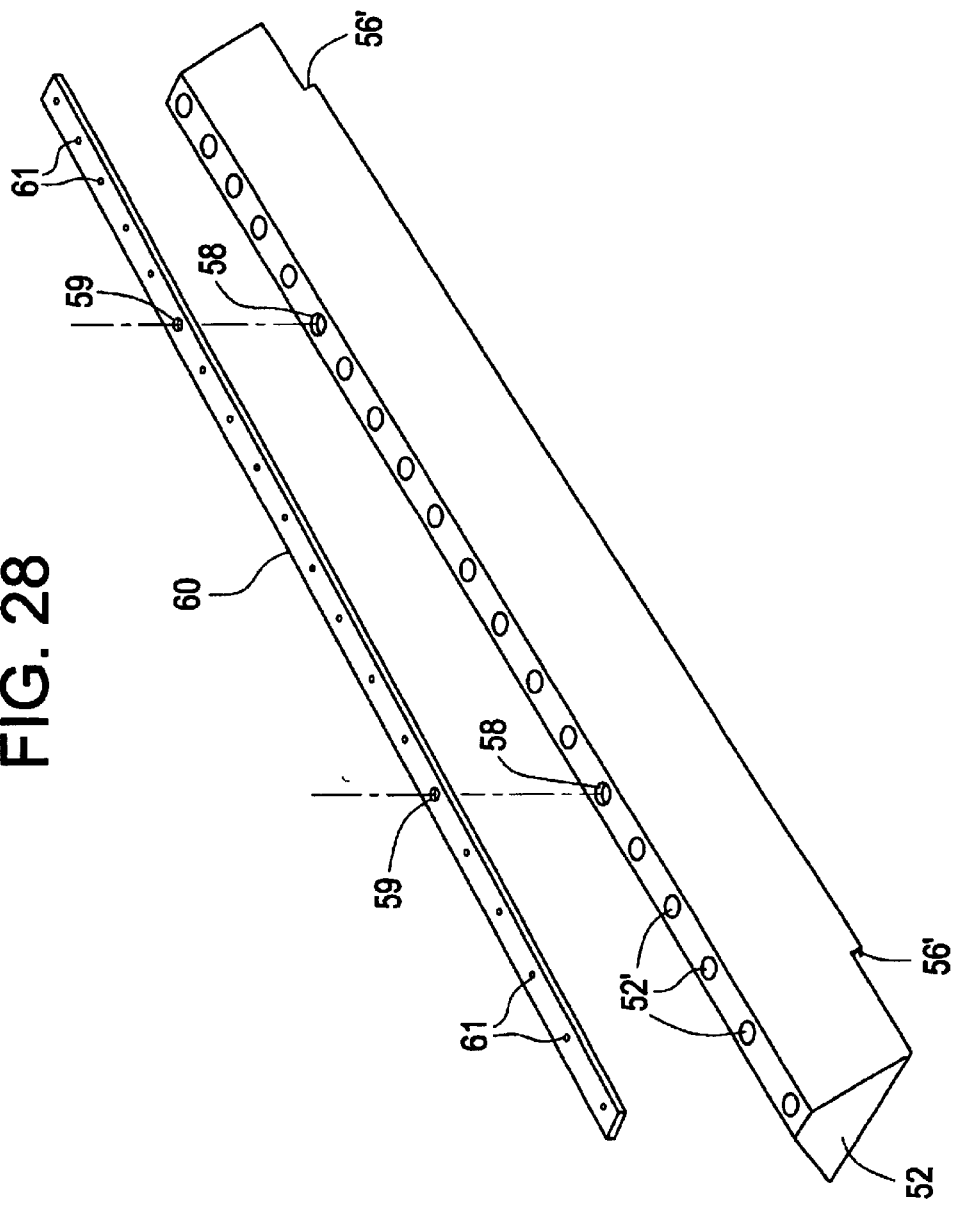

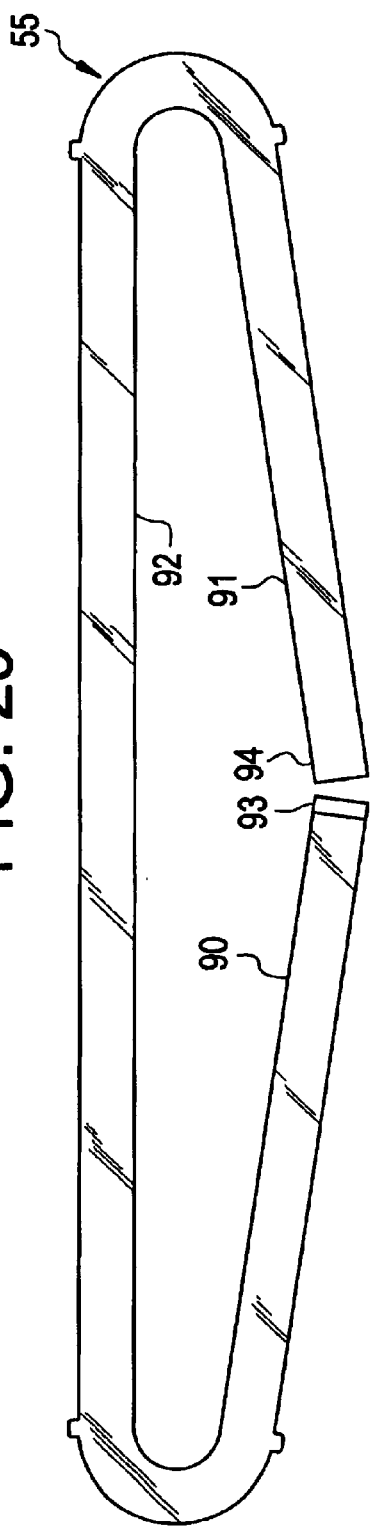
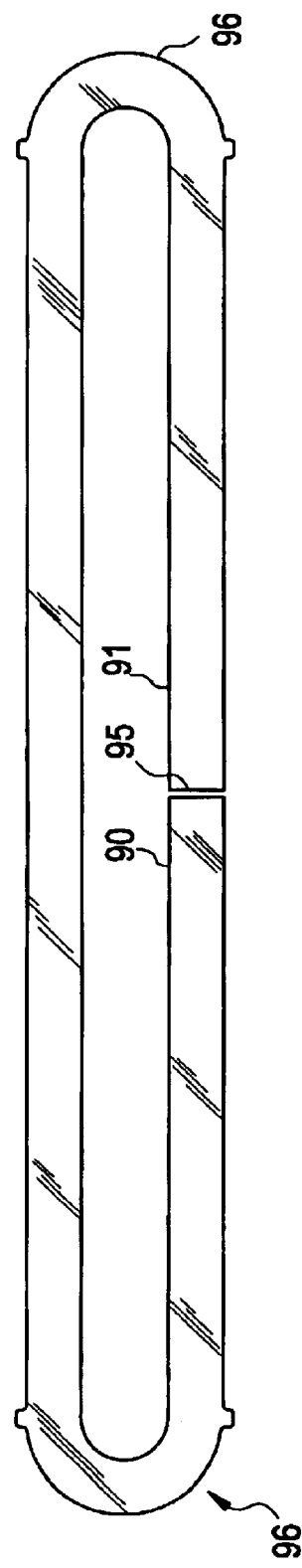

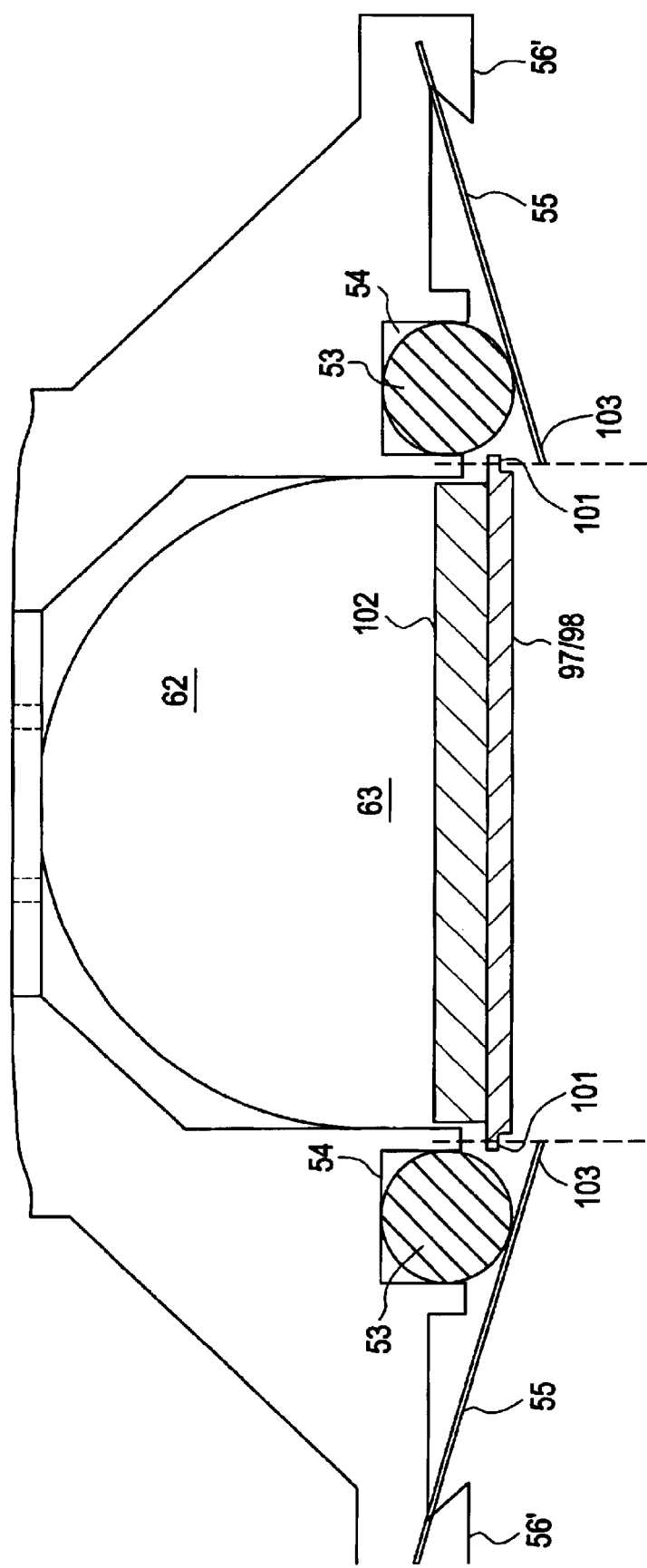

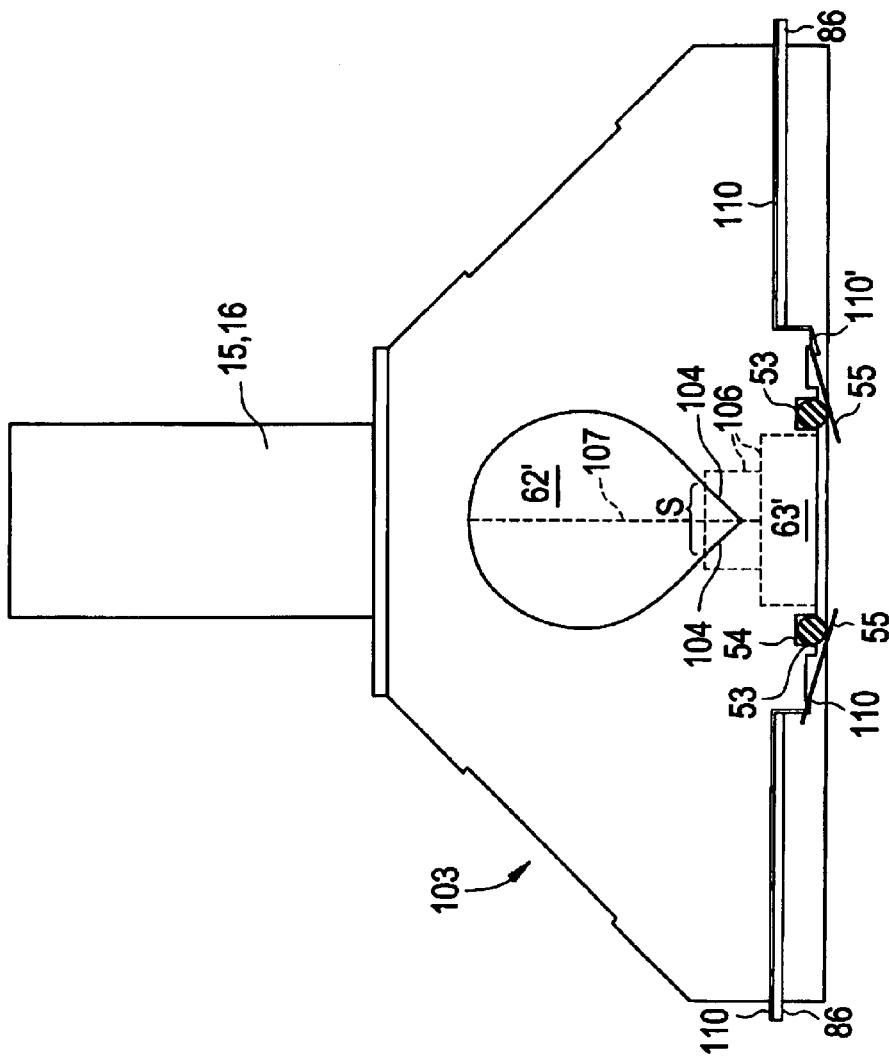

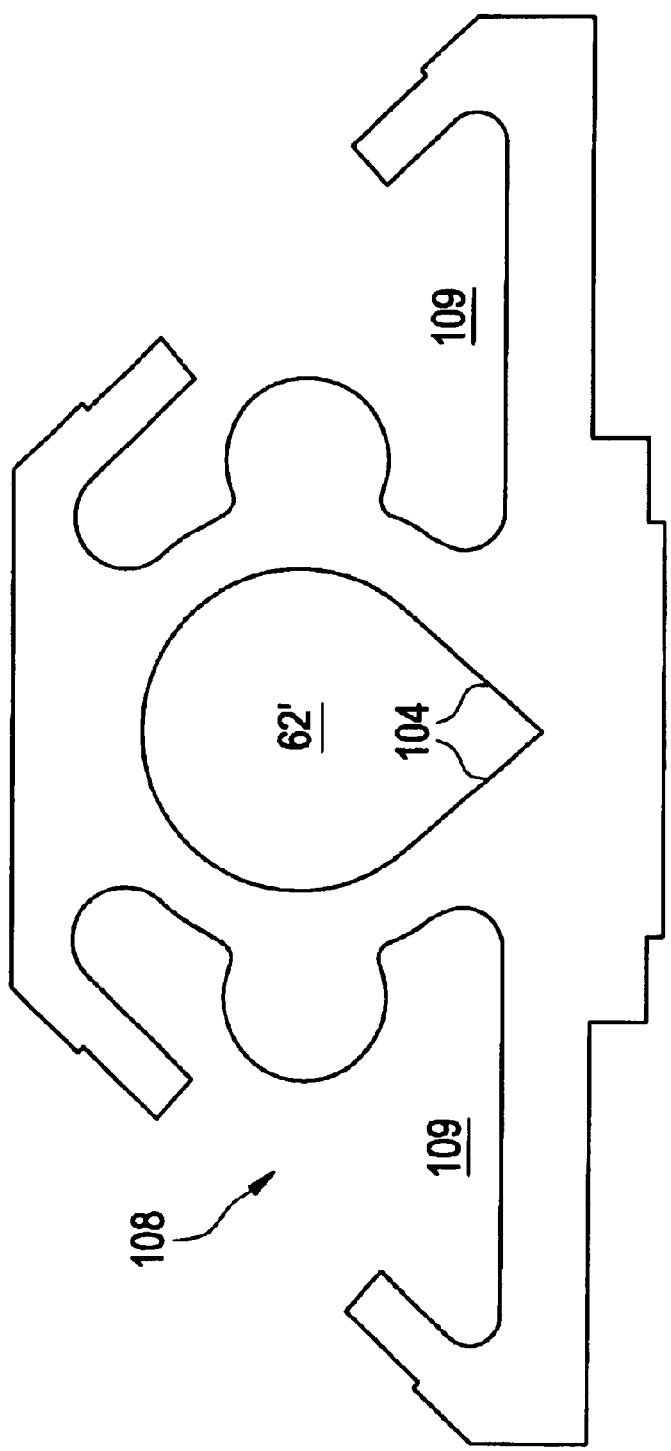

METHOD AND APPARATUS FOR APPLYING A VISCOUS OR PASTE MATERIAL ONTO A SUBSTRATE

BACKGROUND OF THE INVENTION

The present invention relates to an apparatus for applying a viscous or paste-like material through apertures in a stencil onto a substrate beneath the stencil and is particularly suitable for applying solder paste onto a board for producing a printed circuit board or for applying an adhesive or other bonding agent to a substrate via a stencil.

Control of the flow characteristics and composition of materials and the pressure thereof in the stencil printing onto substrates is very important if good results are to be achieved.

Difficulty has been hitherto experienced in balancing or controlling the higher pressure required for displacing solder paste from a reservoir to dispensing pressure relative to the lower pressure required for deposition at the actual stencil surface and it is with the resolution of such difficulties with which our aspect of the present invention is concerned.

With solder paste material and other materials which may contain volatile components it is important to confine the material within a relatively closed space to prevent evaporation and where the materials are thioxotropic or contain such additives, it is important to minimise any evaporation. It has now also been discovered desirable and advantageous to maintain a movement of the viscous or paste-like material, especially immediately prior to application so as to maintain relatively constant rheological characteristics of the soldering paste and it is with this object with which a first aspect of the present invention is concerned.

Recent attempts have been made to provide improved apparatus for application of solder paste such as in WO/96/20088 of Ford Motor Co. Ltd. (PCT/GB95/03002) wherein a compression head cap provides a contained environment to direct and to aid the flow of pressurised viscous material through openings (48) in the stencil. The compression head cap (8) includes two generally parallel wiper blades (78',78) acting on the stencil with their end edges only that are in sliding communication with the stencil (46). Longitudinal diffusion plates (90) guide and equalise flow of the viscous material into the volume between the two generally parallel and upwardly extending wiper blades (78',178) acting on the stencil with their end edges only. In this apparatus the viscous material is forced through the interior chamber (66) of the compression head (6) wherein it is diffused by a diffuser (90) with the material then flowing into the exit (68), and then on to the stencil surface. EP-A-0504501 Zimmer and U.S. Pat. No. 4,023,486 also disclose some of these features of Ford.

In WO 98/16387 Societe Novatec S. A. (PCT/EP97/05761) the apparatus of the Ford disclosure is described as not overcoming realised problems and possessing various disadvantages. Specification WO 98/16387 of Novatec discloses a hollow receptacle (7) in which a piston (10) is displaceable to urge soldering paste (9) through apertures in a grill (17) functioning as a homogenising element upstream of two inclined wiper members (15,16) and then between the upper members (15,16) and onto the stencil and through the apertures in the stencil. In this device there are no means within the hollow receptacle (7) above the grill (17) for creating a flow of paste material other than through the grill and, furthermore, a considerable amount of paste may remain in the space defined beneath the grill and partially encompassed by the wiper blades—which may lead to a reduction in quality of paste or other material when the device is temporarily out of use. DE offenlegungschrift 2250092 discloses a similar arrangement to Novatec.

SUMMARY OF THE INVENTION

According to a first aspect of the present invention there is provided apparatus for use in a stencil printing machine which has a carriage for executing reciprocable movements or strokes, for applying a viscous or paste fluid material to the surface of a stencil and through apertures therein onto a substrate, said apparatus comprises a fluid material applicator device which is slideable along an upper surface of a stencil and has at least one aperture in the lowermost surface through which may flow the fluid material to be deposited on the substrate below, at least one fluid material reservoir or means for receiving such in fluid material flow-communication with a flow passage in said applicator device, and means operable for displacing the fluid material during each stroke of the stencil printing machine of an amount greater than necessary to supply fluid material to the at least one outlet aperture for deposition on the substrate via the stencil.

The greater amount of fluid material which is displaced in the applicator device often requires a significantly greater pressure than desirable for application of fluid material to the stencil, and it has been found desirable for a pressure reduction means, such as a partition with one or more apertures or other flow restriction means, to be provided prior to said at least one outlet and preferably between a main flow passage of the applicator device or head and a passage leading to such outlet. A significant reduction of pressure is often required, such as in the order of a ratio of 6 to 1, for example, in a reduction of say 30 p.s.i. to 5 p.s.i.

In a second aspect according to the present invention there is provided apparatus for use in a stencil printing machine and for applying a viscous or paste-like material or other fluid material through apertures in a stencil and onto a substrate beneath the stencil, comprising a fluid material applicator device which is slideable along an upper surface of a stencil in fluid retaining relationship therewith and has a main-flow passage in which fluid material may flow in alternate directions or through which fluid material may flow in alternate directions or in reciprocable manner or may flow intermittently interruptably or continuously in the same direction and also communicates with at least one aperture in the lowermost surface through which may flow the fluid material to be deposited on the substrate, and at least one fluid material reservoir or means for receiving such in fluid material ducting flow-communication with said main-flow passage, and means for exerting pressure on said fluid material alternatively from either end of said main flow passage preferably after each stroke of the printing machine, or means for exerting pressure intermittently or continuously in the same direction, with means preferably provided or available for accommodating the flow of fluid material resulting from said pressure application which is additional to the flow of material required for a deposition on the substrate.

Preferably two reservoirs will be provided one at either end of said main flow passage and preferably comprise two cartridges as piston cylinder arrangements and with the pistons alternately displaceable during each stroke of the stencil printing machine so as to drive fluid material in opposite directions, even if only for two or three millimeters, for example, to keep the level of the fluid moving during printing.

Preferably the lowermost surface of the applicator device is planar or substantially planar and the device is such as to enable the two pressure members of the printing machine, in use when the applicator device is located thereunder, to be urgeable against receiving means on the upwardly facing side of the device, so that the planar lower surface is urgeable against the upper surface of the stencil on which it is sliding and the pressure members alternate in application to be on the downstream side of the device with respect to the direction of displacement of the device and above the sealing edge of the at least one lowermost aperture.

In one embodiment, an elongate slot as said at least one aperture is provided for the passage of paste or other fluid although such may be multi-apertured such as in the form of a grill or mesh or the like, and preferably the sheet of material defining such will be integral and preferably the sheet of material will provide an uninterrupted or continuous non-apertured region surrounding the apertured region.

Preferably the applicator device will have two reservoir means connectable and/or connected to be in communication with the opposite ends of the ducting means or main flow passage and displacing means such as a piston may be provided for each reservoir means for enabling the fluid means in the free flow passage to be preferably alternately displaceable from a first reservoir means into the main flow passage and for some fluid already in the main flow passage to be displaced therefrom into a second reservoir and vice versa.

The present invention may be provided as a removable/replaceable apparatus for a screen printing machine and the features of design mentioned herein enable optimum utilisation of the paste with minimum waste. Preferably two reservoirs are provided, with each reservoir being detachably removable and replaceable with a fully charged like reservoir for speed and simplicity of screen printing.

The apparatus of the present invention may be fitted/retrofitted to existing screen printing machines whereby the previously used squeegee members are removed from the displaceable arms of the machine and the present apparatus located in position under and alternately held by means of the displacing arms as such are alternately reciprocated upwardly prior to horizontal displacement by the carriage of the printing machine. The displacement arms of the screen printing machine are normally alternately displaceable in upward and downward movement of the pressure members attached to the machine and shoulder or other arm-receiving means are provided on the present apparatus to receive the pressure which facilitates fluid sealing of the applicator device in sliding relationship on the stencil and also to enable the present device to be horizontally driven in alternative directions.

The reservoir is preferably of light material such as plastics material so as to possibly be disposable or rechargeable.

The apparatus of the present invention minimises the risk of viscous materials becoming stiff or otherwise unsuitable and also reduces amount of material which might be wasted and enables a rapid replacement of the reservoirs.

Also according to the present invention there is provided a pressure reducing and dispensing foil or foil members having in one embodiment three walls or surfaces triangularly disposed or disposable and comprising a lowermost, generally planar apertured wall having at least one aperture therein for the throughflow and deposition of paste onto a substrate, and two lateral walls extending from opposite elongate edge regions of said lowermost wall and extending upwardly and convergingly with at least one said lateral wall having one or more pressure reducing apertures provided therethrough, and preferably a plurality of such apertures spaced along each wall, and alignable with apertures in a lower support or retaining member. Preferably the foil will have end walls to close the ends of the defined passage.

Whilst the foil described above and illustrated in FIGS. 6A and 7 is one piece, for ease of changing the lowermost apertured foil part or member, such foil may be provided in four parts, an upper apertured pressure reducing part, two lateral retaining parts with retaining edges for holding the main lower defined foil member defining the lowermost paste exit aperture or apertures as will now be defined.

In a preferred embodiment, however, there is provided a pressure reducing foil comprising an apertured strip wherein the apertures when located in an applicator device act to reduce the pressure in the fluid before it flows to the outlet defined by a separate lowermost flexible foil member which preferably has a continuous peripheral portion defining the outlet aperture or apertures and in effect forms a fluid medium printing gasket. Thus in a simple form of this preferred outlet foil or printing gasket, there is provided an elongate flexible foil or metal sheet member having an elongate slot extending along its length and defined by the periphery or preferably detent means are provided for releasably engaging with shoulders as thin retaining foils clamped on the device. Preferably such retaining foils will have different fold lines so as to permit interchanging so as to provide for different positions of retention of the outlet foil. Alternatively, the lower apertured foil member may be held laterally in channels formed in the base of the applicator device instead of by lateral foil members.

Preferably resilient sealing means, such as a resilient ring, such as an O-ring will be provided in a groove to urge the lower foil member downwardly to seal against a stencil in use.

The present invention is intended to encompass such foils in flat unfolded form also.

Also according to the present invention a screen printing apparatus whenever adapted or modified to incorporate the apparatus with pneumatic control of the present invention.

It is also envisaged that an especially dedicated machine might be provided rather than modification of existing or retrofitting of existing machine.

Also according to the present invention a method of applying a viscous or paste or like fluid material through a stencil to a substrate comprises displacing more fluid material than is necessary for the application of the fluid material to the substrate for each operative application movement.

In a third aspect according to the present invention there is provided apparatus for use in a stencil printing machine and for applying a viscous or paste-like material or other fluid material through apertures in a stencil and onto a substrate beneath the stencil, comprising a fluid material applicator device which is slideable along and supportable by an upper surface of a stencil in fluid sealing relationship therewith and has a main flow passage which communicates with at least one dispensing aperture in the lowermost surface through which may flow the fluid material to be deposited on the substrate, and at least one fluid material reservoir or means for receiving such fluid material in ducting flow communication with said main flow passage, and means for exerting pressure on said fluid material in said reservoir, and pressure reduction means for reducing the pressure of the fluid material located between the dispensing aperture and said main flow passage.

The lower-pressure ducting means is defined in part by a pressure reduction and carrier member which does not reduce in cross section towards the sealing means or gasket but rather increases in transverse cross section.

Said at least one dispensing aperture and the pressure reduction means may be provided as separate parts each of which is detachably mounted on a support and replaceable with an identical component, if one is worn or damaged, or with a differently apertured component if a different fluid is to be applied. Also the pressure reduction means or part may be replaceable as desired and may be modified as desired by selecting appropriate aperturing on the component and the manner of deposition of the fluid material from the device determined by selecting the requisite size and/or shape and/or pattern or arrangement of the lowermost aperturing. This replaceable component may be formed by flexible sheet material or foil and is indicated on the accompanying drawings as an injector foil.

Preferably, the main housing or body of the applicator device according to the invention which defines the main flow passage and the reduced pressure flow passage interconnected by fluid material pressure reduction means is formed as one piece or integrally formed and preferably formed by extrusion, for example, in aluminium. The construction achieves considerable economy in manufacture and assembly and ease of use. In this one piece or integral construction, the pressure reduction means is preferably formed as a slot or elongate passage extending along preferably almost the whole of the length but terminating short of the ends.

This elongate pressure-reduction passage is advantageously formed by having the main body extruded with the main flow passage extending therealong, and preferably such that the lower sidewalls defining such converge (possibly somewhat in the manner of the section through the bottom of an inverted tear drop or water drop), and then machining in the lower face of the housing a reduced-pressure flow passage or recess, terminating short of the ends, and machining or cutting into the converging sidewalls defining the main passage to a sufficient extent and in a manner as desired to form an elongate slot or passage of a width to achieve the required pressure reduction. The elongate slot may be of constant cross-section or width or by varying the depth of machining may be of varying width, for example, may be narrowest near the inlet from the fluid reservoir or reservoirs and enlarge away therefrom to the middle and then converge again towards the other end and inlet of the other fluid reservoir when two such are provided. The varying of the width of the elongate slot is such as to distribute the fluid as evenly as possible along the slot and into the reduced-pressure flow passage The outlet aperture defining member or printing gasket is preferably in the form of a flexible metal foil with a continuous peripheral portion whose inner edge acts as a fluid wiper and is preferably backed by a resilient member such as an O-ring. Preferably a spacing member surrounds or substantially surrounds the gasket and is preferably of a material, such as PTFE, which facilitates sliding of the applicator device on a stencil and also is one determining factor as to how much the gasket foil is flexed against the O-ring in use. The provision of the spacing means or member around the gasket enables a gasket with different length of aperture or apertures to be used and thus the device of the present invention can be used on substrates of different widths.

In a further aspect of the present invention there is provided a fluid applicator device comprising a cross print-head or body means defining fluid ducting means and in communication with connection means, provided for connection of a fluid reservoir means, and said ducting means leading to an outlet passage in the lower surface of the device slidable on a substrate, characterised by the feature that the outlet passage comprises an aperture or apertures through which fluid flows to be deposited onto and through a stencil therebeneath, is defined by a gasket or sealing means in the form of a thin sheet of material (such as a metal foil) having a continuous peripheral portion surrounding the paste outlet aperture or apertures with an outer portion of said sealing means being secured to the body means or part thereof (preferably located in two parallel containing grooves or channels extending parallel to a central elongate opening) and being supported on its upper surface against yieldable means or resilient means (such as a rubber O-ring located in a groove) and which, peripheral portions incline downwardly preferably only slightly downwardly out of the horizontal plane or plane of the base of the body; and when not subject to counter pressure, the aperture defining edge(s) extends beneath the lowermost plane of the body means in which the lowermost surface(s) of the body or any spacing means lie by an amount such that when the applicator device is supported on a surface (such as on top of a stencil), the inner part of the peripheral portion and sealing edge of the gasket or sealing means are flexed/deflected upwardly against the counter pressure of the resilient means (preferably a rubber O-ring) so as to provide a sliding seal for preventing or minimising the escape of fluid.

Preferably spacing means or members (or a "shoe") are provided located outwardly of the aperture edges of the sealing means or gasket either at opposite ends and/or along opposite sides although preferably being provided located extending beneath and along and around all sides of the peripheral portion of the sealing means and leaving a central space into which the aperture—defining edge(s) of the deflected portions of the sealing means or gasket extend. Thus the aperture-defining edge(s) of the gasket or sealing means extend beneath the plane in which the lowermost surfaces of the spacing means lie by an amount such that, in use, when supported on a stencil, the inner part of the peripheral portion of the sealing means is flexed upwardly against the resilient means so as to provide a sliding seal. The spacing means thus partially act to determine the pressure exerted by the gasket edges or sealing means.

Preferably the opposite ends of the gasket or sealing means will be pre-formed or pre-stressed so as to have a part-conical or hemispherical or other curved surface or other shaped surface to improve the sealing effect when flexed in use. Thus the resilient means e.g. an O-ring, acts on the broad face of an inner part of the outer continuous peripheral portion and thus does not act on the outermost end edge where the gasket or sealing means is secured.

Thus also according to the present invention there is provided a sealing means or gasket for an applicator device for solder paste or other fluid for use in stencil printing formed of an elongate, thin sheet of flexible material and comprising a continuous outer peripheral portion defining an inner apertured region for the passage of fluid, with opposite end regions of the continuous peripheral portion being pre-formed or shaped and pre-stressed to provide part conical end regions or an otherwise-curved or -shaped opposite end regions. This can be achieved by forming a sheet blank as a development of the desired resultant shape with straight parallel but inclined faces and of curved opposite ends and which necessitates in the flat, a straight side with opposite end regions running into a side which is divided and of inclined parts and then joining the parts to form the requisite part conical or other opposite end regions—when the elongate sides are pressed parallel with the outer edges lying in the same plane so as to then become inclined.

Also according to the present invention there is provided a means for adapting a solder paste stencil printing machine having two reciprocable squeegee blades detachably mountable in receivers in two vertically and horizontally reciprocable carriers, comprising two elongate cross members securable by securing means in the receivers in the carriers and so as to extend parallel to each other, and a fluid applicator device having at least one projection slidably engageable by one or both of said cross members so as to enable said device to be reciprocably displaced upon operation of the machine. Preferably two projections extend from the device and are clamped between the cross members which are vertically slidable relative thereto. Spring means may be provided to maintain pressure of each cross member on the applicator device irrespective of its vertical position.

Also according to the present invention, a method of applying a viscous or paste or like fluid material through a stencil onto a substrate comprises reducing the pressure of fluid material prior to it being applied to the stencil and substrate.

BRIEF DESCRIPTION OF THE DRAWINGS

The invention will be described further, by way of example, with reference to the accompanying drawings, in which:

FIG. 1 is a side elevation of a preferred embodiment of the apparatus according to the present invention viewed in/from the direction to which or from which the apparatus is reciprocatably displaceable when mounted on a screen/stencil printing apparatus (not shown);

FIG. 1A is a schematic transverse cross section of the apparatus of FIG. 1 illustrating the positioning of the apparatus of the invention relative to the vertically reciprocal pressure arms (only part shown) which exist on known screen printing machines (not shown) for applying hitherto squeegees with one right-hand said pressure member being downwardly displaced in its operative pressure applying position and the other, elevated and prior to reversal of the positioning;

FIG. 2 is an enlarged schematic cross-sectional view of the apparatus of FIG. 1 on its own and in through the region of one end;

FIG. 3 is a section illustrating the manner of securement with screw means of an applicator foil and foil retaining means with the main applicator device body also referred to herein as the main print head body;

FIG. 5 is a plan of an applicator foil device prior to folding of the lateral longitudinal sides and triangular ends and illustrating a single rectangular aperture and surround which forms the lowermost surface of the device;

FIG. 6 is a transverse central section of the preferred applicator foil of FIG. 5;

FIG. 6A is a transverse central section of a modified applicator foil of the print head body of the apparatus of FIG. 1.

FIG. 7 is a similar view to FIG. 5 showing the applicator foil of FIG. 5 in the left hand end and additionally showing other aperture-sizes and arrangements and shapings of applicator foils which might form the lowermost surface of the applicator device for depositing fluid material from the apparatus;

FIG. 8 is a transverse section through the applicator device/ print head body;

FIG. 9 is a side elevation of the device of FIG. 8;

FIG. 22 is a plan from below of the applicator device of FIG. 19;

FIG. 23 is a plan of a "keeper" or sealing member in the form of a clear plastics block with securing apertures and a closeable air bleed aperture;

FIG. 28 is a perspective view from above of the pressure reducing and mounting member on its own and with an additional pressure reducing plate for securement to the top and provided with smaller apertures suitable for use with less viscous fluid;

FIG. 29 is a schematic illustration of what might be regarded as a development of the eventual shape of a preferred form of sealing gasket;

FIG. 30 indicates the shape of such in the final form of use with the sides made parallel;

FIG. 35 is an enlarged fragmentary section through an embodiment similar to FIG. 34;

FIG. 36 is a transverse schematic cross-section through a modification of the embodiment of FIG. 21 wherein instead of a print head body and separate mounting and pressure reduction means the two are integrally formed as an extrusion; and FIG. 37 is a preferred extrusion shaping with cavitied side walls for savings.

DESCRIPTION OF THE PREFERRED EMBODIMENTS

Figure 4:
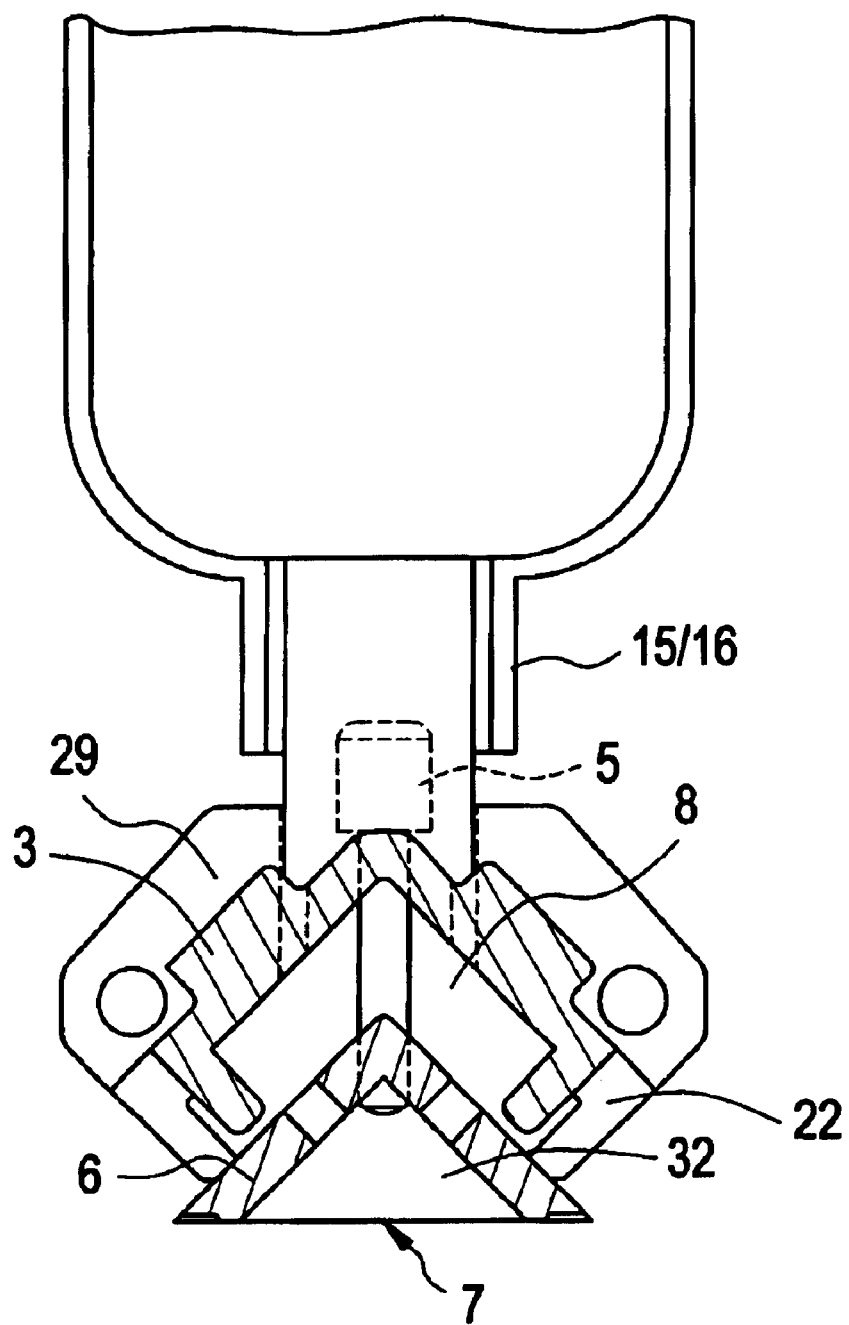
FIG. 4 is an enlarged fragmentary detail similar to FIG. 2.
Figure 10:
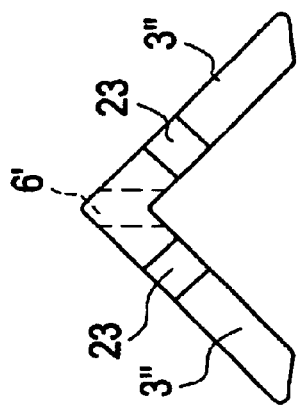
FIG. 10 is a transverse section through the elevation of FIG. 11 of one form of an applicator foil retaining member with threaded securing apertures in the apex and a row of through-flow passages either side forming a means for reducing the pressure of the fluid material.
Figure 11:
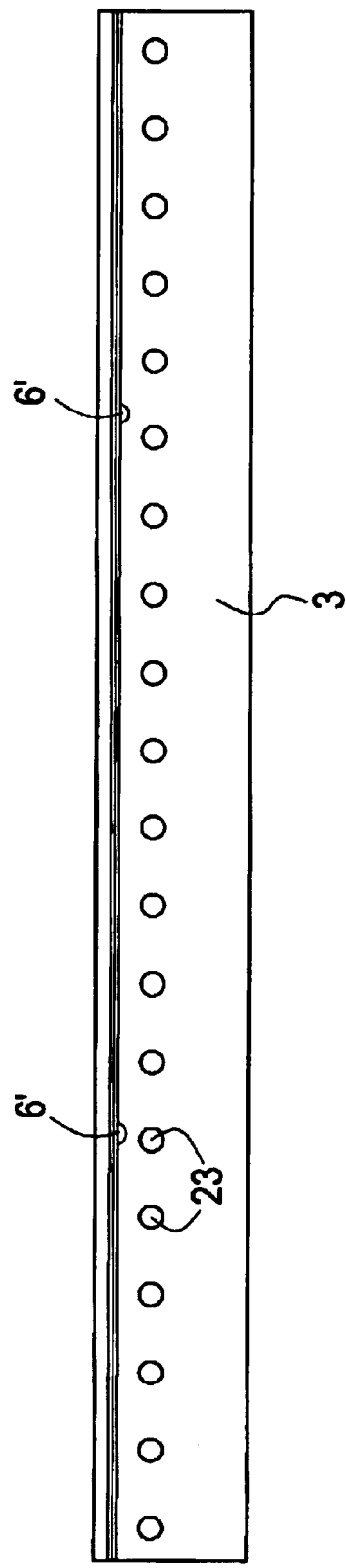
FIG. 11 is an elevation of the foil of FIG. 10.
Figure 12:
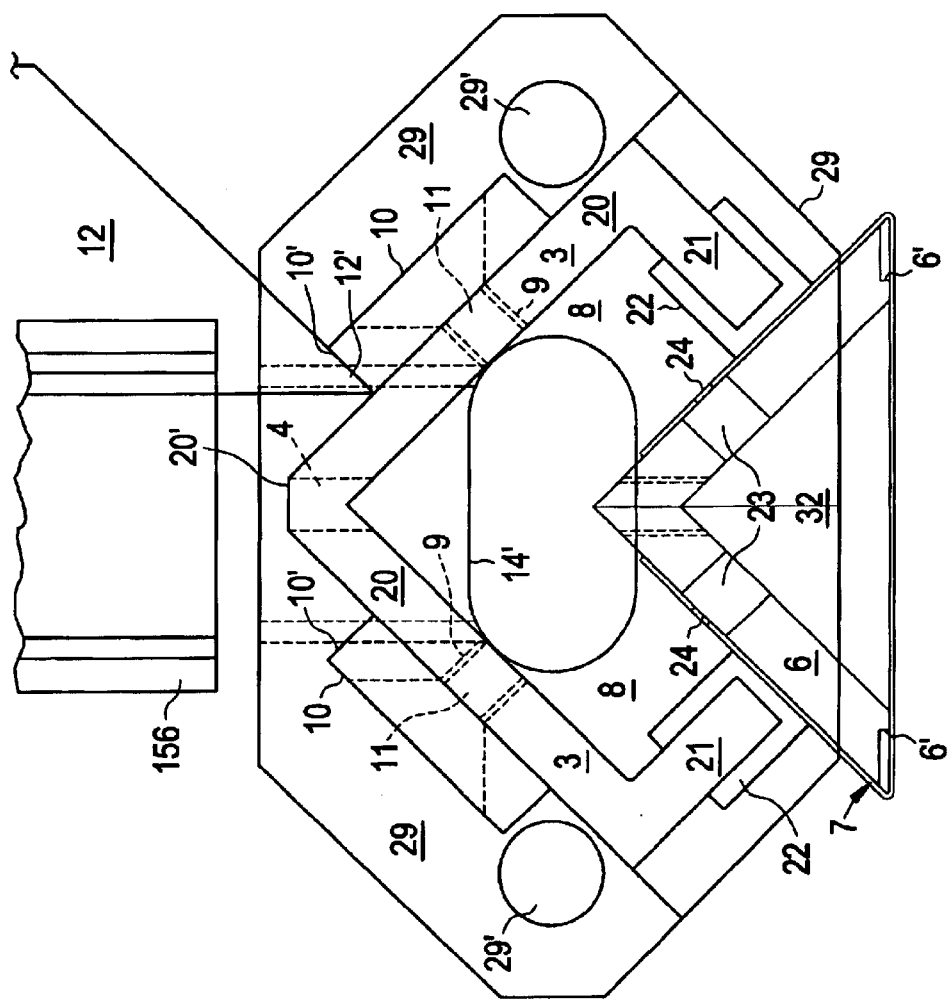
FIG. 12 is an enlarged fragmentary section similar to FIG. 1A illustrating alternative flanged edgings/reinforcements for the lowermost aperture.

There is illustrated an apparatus 1 for use in a stencil printing machine for applying paste media or other fluid material through apertures in a flat stencil (not shown) on to a substrate or board (not shown) beneath the stencil and comprises an elongate fluid material applicator device or print head body 2 which is slideable along the upper surface of a flat stencil in fluid retaining relationship therewith and is formed of a main print-head body 3 (illustrated on its own in FIGS. 8 and 9) which generally comprises two inclined limbs or portions 3',3" arranged in L-shaped mirror-like image disposition and which may be formed from an aluminium extrusion. A plurality of bolt receiving apertures 4 are provided at the apex of the body 3 through which threaded bolts 5 may extend and be sealable therewith with the lower end of said bolts 5 being engageable in the threaded apertures 6' on the apex of the roof-like foil retaining member 6 so as to draw said foil retainer member 6 and any injector or applicator foil 7 thereon into sealing engagement with the lower free ends of the disposed portion 3', 3" so as to define a main flow passage 8 therewith.

The downwardly outwardly sloping outermost faces of the print head body 3 also have threaded blind bores 9 therein to enable elongate rectangular stop plates 10 to be secured thereto by bolts 11 which provide shoulders 10' for alternatively receiving the tips 12',13" of the pressure members 12,13 which are provided as adapter blades of the screen printing machine and are locatable in place of known squeegee blades on the printing machine and securable by threaded headed bolts in similar manner as the squeegees. These pressure members 12,13 act both to apply downward pressure on the body 3 and also to drive the whole apparatus during each stroke of the printing machine. It is envisaged desirable (although not shown) for two cylindrical projections to be provided extending upwardly from the central upper surface of body 3 and which are engageable in scalloped recesses or otherwise on the facing vertical surfaces of blades 12,13 so as to also centrally locate the present apparatus laterally and for a sliding contact to exist so that the blades 12,13 remain in contact at all times during operation in both their upper and lower positions.

At either end of the high pressure zone or main flow passage 8, an upwardly extending threaded duct 14 (opening as 14' in an end block) is provided in which there is screwable the lower end of a solder paste cartridge 15,16 having a pneumatically displaceable piston 17/18 therein. A suitable cover (not shown) and pneumatic supply means (not shown) and control (neither shown) and provided so as to enable pressurisation on the space above the pistons 17/18 in each reservoir means or cartridge 15,16 and controlled to exert pressure thereon in alternate manner during the intermittent displacement stroke of the screen printing apparatus to the present apparatus is attached to. Thus pressure is applied alternately to the reservoirs 15,16 causing a small amount of paste to move alternately out of each reservoir and into the through passage 8 with a small amount alternately being displaced into the other reservoir to which the pressure on its piston has been removed. During each stroke perhaps only a movement of approximately five millimeters of paste in the passage 8 may take place. With continued operation and alternate displacements, each of the reservoirs 15,16 is gradually discharged via at least one opening 19 of the bottom of the applicator device which will be described hereinafter.

The foil retaining member 6 is an integral roof-like member also formed as an aluminium extension two elongate rectangular portions 20 subtending an angle of 90° to each other with the angled apex being formed or machined to be flat 20' and normally horizontal. The lower ends of the portions 20 extend via a 90° corner into two lower end strips or lower limbs 21 against which abut (via seals 22) the shaping faces of the print seal body 3 with foil thereon sealingly abut. The lowermost end faces machined to be horizontal although may be stepped so as to provide a shoulder 6' of foil retaining member may be for purpose of intensifying the pressure around the lower opening 19.

As mentioned, apertures 4 are provided along the apex of body 3 for securing of the retaining member 6 against the end faces of the print head body 3 and rubber seals 22 are provided therebetween to ensure appropriate sealing. In retaining member 6 and above the region of the seals 22, a row of apertures 23 are provided and form throughflow passages for the passage of fluid paste from the main flow passage 8 to the space defined between the limbs of the foil retaining member 6 and the foil.

A combined lowermost aperture forming and pressure reducing member or means is formed by foil 7, as illustrated in FIGS. 5, 6, 6A and 7, which comprises an apertured and scored thin metal sheet which has portions which are folded over or slide along the foil retaining member 6 so as to overly such with the two rows of pressure reducing apertures 24 aligning with the through passages 23 in the foil retaining member 3 and with the single rectangular elongate rectangular aperture 19 and surrounding continuous surface 19' forming the lowermost surface of the device or other aperture arrangement such as, for example, also illustrated in FIG. 7 may be selected as desired. The pressure reducing apertures 24 are provided in rectangular side portions 25 and such are foldable along score lines 26 and may be selected as regards size and number for the appropriate application (possibly to provide a pressure reduction of 6:1) and/or as may the shape and dimension and pattern etc. of the lowermost aperture(s) 19. Triangular end flaps 27 are foldable along score lines 28 once the foil member 7 is located on retaining member 6 to close the ends of the passage 8 and are clamped against the ends of retaining member 6 via end plates 29 (with sealing means) which are held in position via threaded tie rods 30 and bolts 31 acting against plates 29 at each end. A slight gap exists between the free longer edges of portions 24 in the folded position.

It has been found highly desirable for the foil 7 in the region of the elongate rectangular aperture 19 have along the parallel longer sides thereof two inclined extensions 7' (shown in FIG. 6A) which are inclined so as to converge together and to underly the lower inner inclined surfaces of the foil retaining member 6 preferably at the same angle as its lower surface and to abut thereagainst to provide for additional strengthening of the elongate rectangular aperture.

As mentioned end plates 20 with appropriate seals are provided at opposite ends of the foil retaining member 6 and print head body 3 with appropriate seals and are securable by threaded tie rods 30 with the knurled tightening ends 31. The tie rods pass through the apertures 29' in the end plates 29.

Thus in summary, with the injector foil 7 located over the foil retaining member 6, there is defined a generally triangular section low pressure zone or passage 32 and the two components are sealingly clamped against the print head body 3 to form the high pressure zone or main flow of passage 8 with the two zones being interconnected via the selected pressure reducing apertures 24 in the foil leading through the normally longer apertures 23 in the foil retaining member 6 to the at least one aperture 19 in the bottom of the foil 7 from whence paste may flow at a suitable pressure to the stencil therebeneath.

Paste is supplied to the main flow passage 8 in body 3 from the reservoir cartridges 15,16 at either end under the alternate pressure action of the upper pistons 17,18 thereof alternately driven by the pneumatic source (not shown) and in operation during a stroke of the printing machine in one direction, pneumatic pressure is applied to the piston of one reservoir cartridge 15/16 whilst the other cartridge 16/15 is not pressurised. At the end of the stroke both reservoirs 15,16 are not pressurised but on the next or return stroke, with paste being applied to another board placed beneath the stencil, the other reservoir cartridge 16/15 is pressurised whilst the first cartridge 15/16 is not pressurised and the process continues accordingly.

The control means and pneumatic pressure for acting on the pistons are such that a large volume of paste exists in main flow passage 8 and which it is desired to keep in movement to maintain the characteristics thereof and to condition such, and to achieve this a considerably greater pressure (for example in the region of 30 p.s.i.) is required than that necessary for the stencilling operation (such as 5 p.s.i.) and thus the apertures 24 are selected such as to achieve an appropriate reduction in pressure having regard to the nature of the paste material etc. It is to be appreciated that during each "stroke" of the printing machine (not shown) some paste material will flow from passage 8 into passage 32 and from there hence to the stencil, and some material needs to flow from passage 8 to achieve sufficient movement (approximately 5 mm in the main flow passage 8) and there is surplus flow into the unpressurised cartridge although other biased receiving means might be proposed.

In order to facilitate changing of the applicator foil, there is devised and illustrated in FIGS. 13 to 17 an alternative embodiment of applicator foil and a modification of the apparatus of FIGS. 1 to 12 as illustrated wherein the main difference is that the applicator foil is formed in three pieces namely the main, lower aperture—defining applicator one-piece foil member 33 with slot-like aperture 33' which is to be held by two lateral retaining foils 34,35 having paste through apertures 24' and a retaining edge 36,37 bent along a fold line 38 to form a space beneath the lower face of the retaining part 6A having through apertures 23' leading to a central passage 39 and thence to the substrate via the elongate slot in foil member 33. Threaded apertures 6B are provided for bolts 5 for clamping securement of the part 6A.

Figure 13:
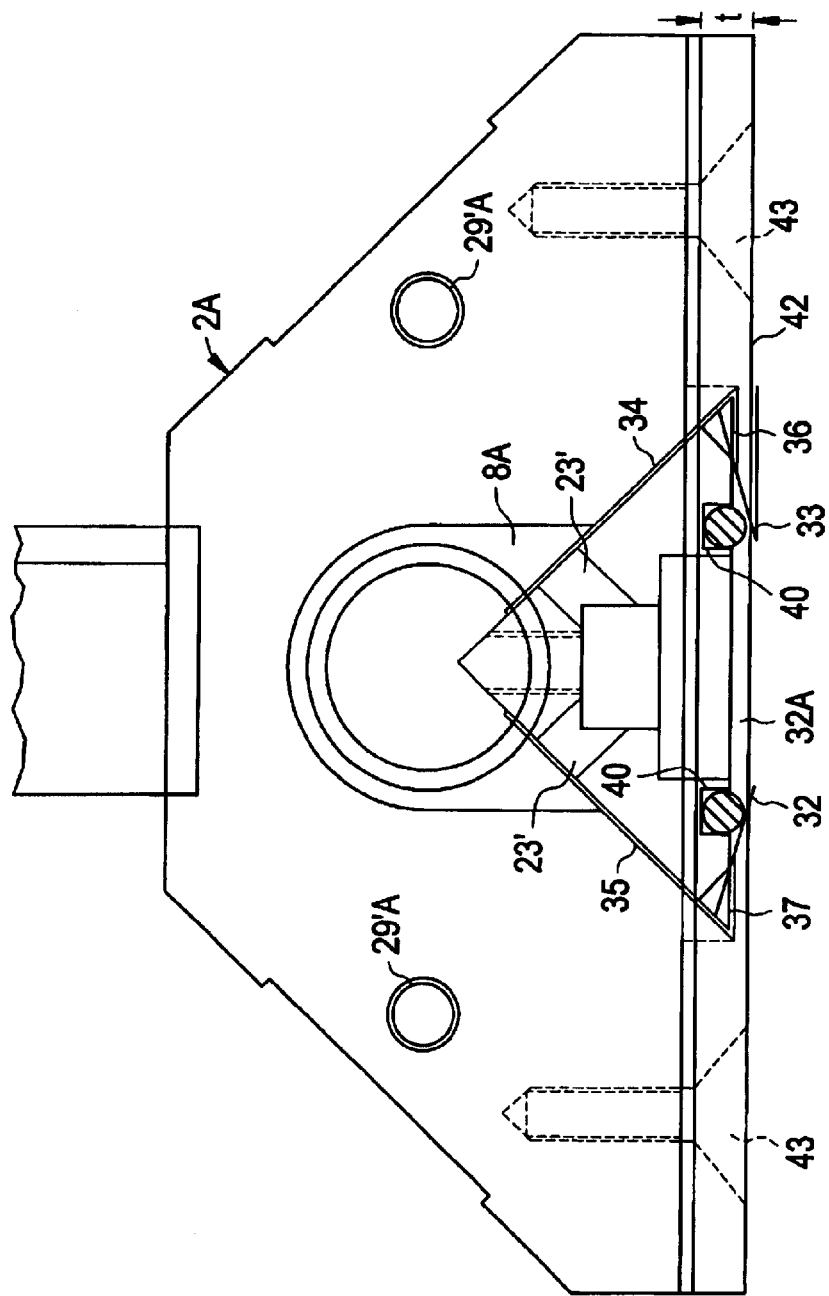
FIG. 13 is a cross section through an alternative embodiment of applicator device and in particular of a main cross-head or print head body with a three part injector foil.
Figure 14:
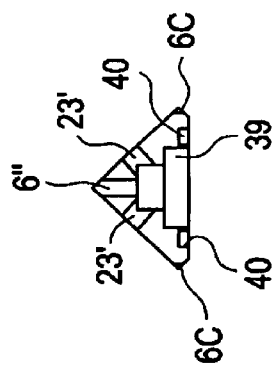
FIG. 14 is a section through a modified foil retaining member on its own.
Figure 15:
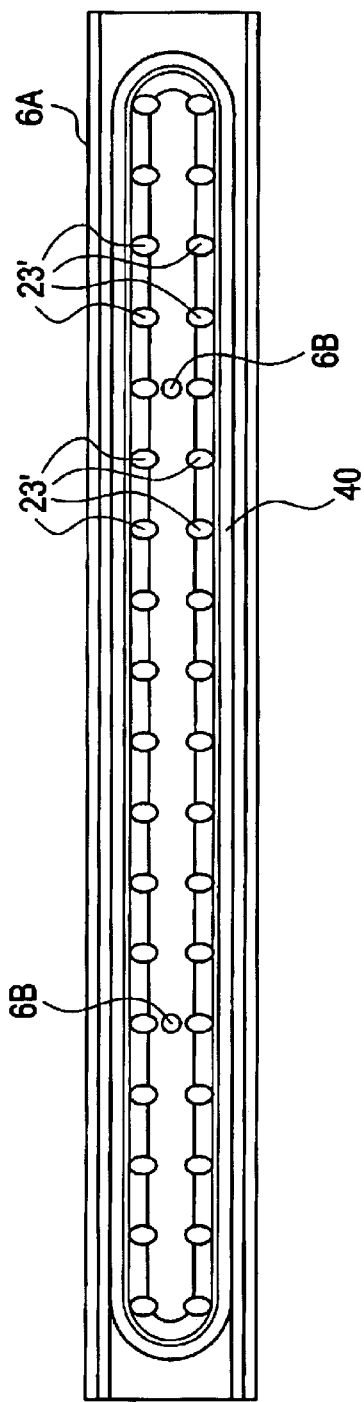
FIG. 15 is a plan from below of the lower side of the foil retaining member of FIG. 14 illustrating the two rows of paste ducting through passages (23') surrounded by a rounded end continuous channel for receiving a resilient endless band.
Figure 16:
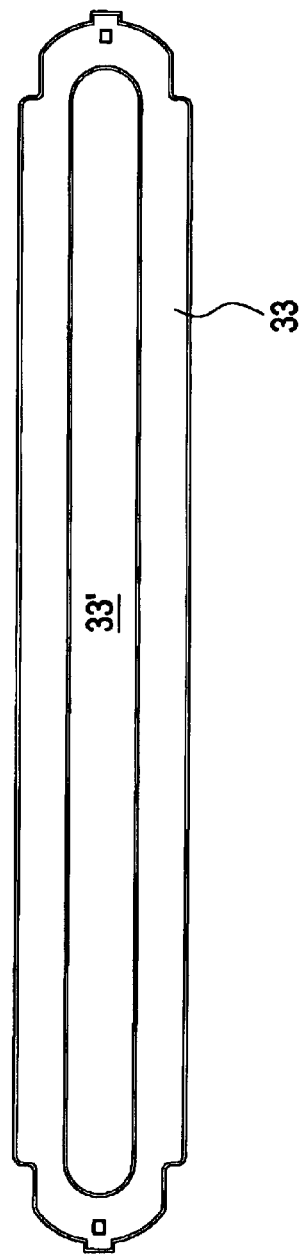
FIG. 16 is a plan of part of a preferred embodiment of applicator foil defining the lowermost aperture (elongate slot in this example) and which is held in position by two captive and angled lateral retaining foils and which in use lies under the resilient band.

A continuous groove or channel 40 is provided in the lower surface of part 6A for partially receiving a resilient endless ring or band or O-ring 41 which extends out of the channel 40 to press against the upper surface of foil member 33 around the slot thereof and act as a seal and also to act as biasing means to cause the foil member 33 to be deflected and/or flexed downwardly as shown in FIG. 13 and which is subject to counter pressure when applied to the surface of a stencil to thereby increase the sealing effect. The side edges 6C of part 6A are angled or provide space for flexing of foil member 33 held captive by edges 36,37 of foils 36,37.

It will be appreciated that foils 36,37 will inwardly and oppositely facing retaining edges 36,37, are claimed in position in the print head body 2A closing off the main flow passage 8A therein whilst permitting flow via passages 23'. The foil member 33 can then be slid-in from one end of the body 2A between edges 36,37 and the lower surface of part 6A and the ring 41 to underlie the lower pressure zone 32A in part 6A.

The foil member 33 has a continuous outer peripheral portion surrounding the slot 33' to ensure sealing against escape of paste. Alternative aperture arrangements are possible other than slot 33' whilst keeping a continuous periphery and the other apertured foil members may be readily exchanged by sliding in from one end.

A spacing block 42 (only one shown in FIG. 13) is screwed by screws 43 at opposite ends of the lower face of the print body 2A of a required thickness "t" to provide clearance beneath part 6A for the downward flexing of foil 33 but under sufficient back pressure in use from the stencil (not shown) therebeneath for adequate sealing. These spacing blocks 42 across the ends of body 2A are preferably of a plastics material such as PTFE or polypropylene or like to facilitate sliding with minimal wear. The blocks 41 also clamp the opposite ends of the foils 34,35 and foil member 33 in position.

Figure 18:
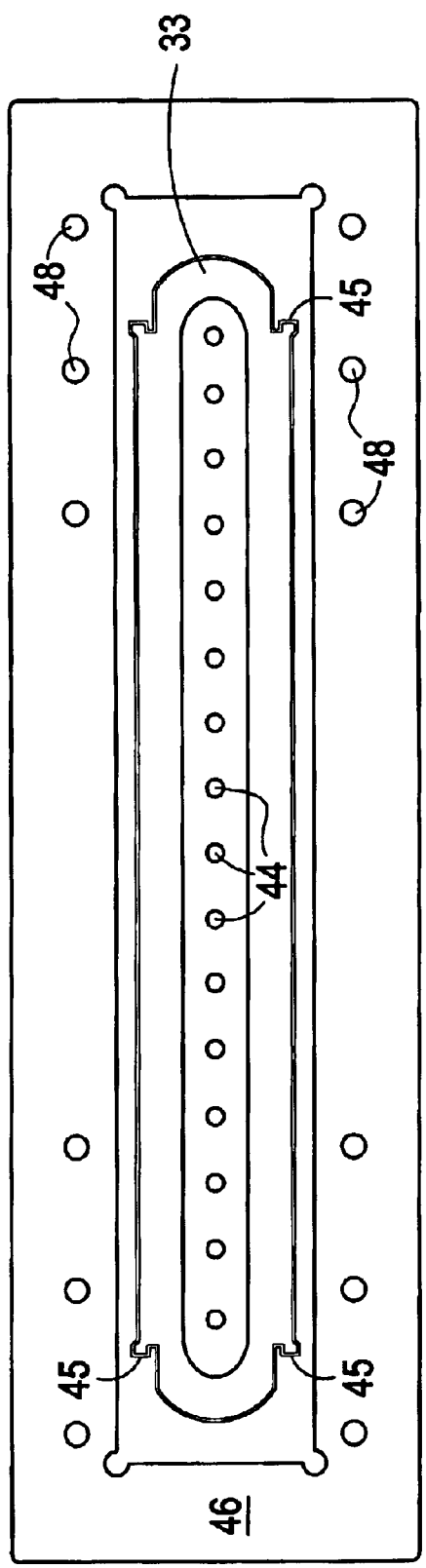
FIG. 18 is a view of a further embodiment of applicator device and comprises a schematic plan from below of an applicator device only showing a one-piece spacing member surrounding an applicator foil or media printing gasket similar to that of FIG. 16.
Figure 19:
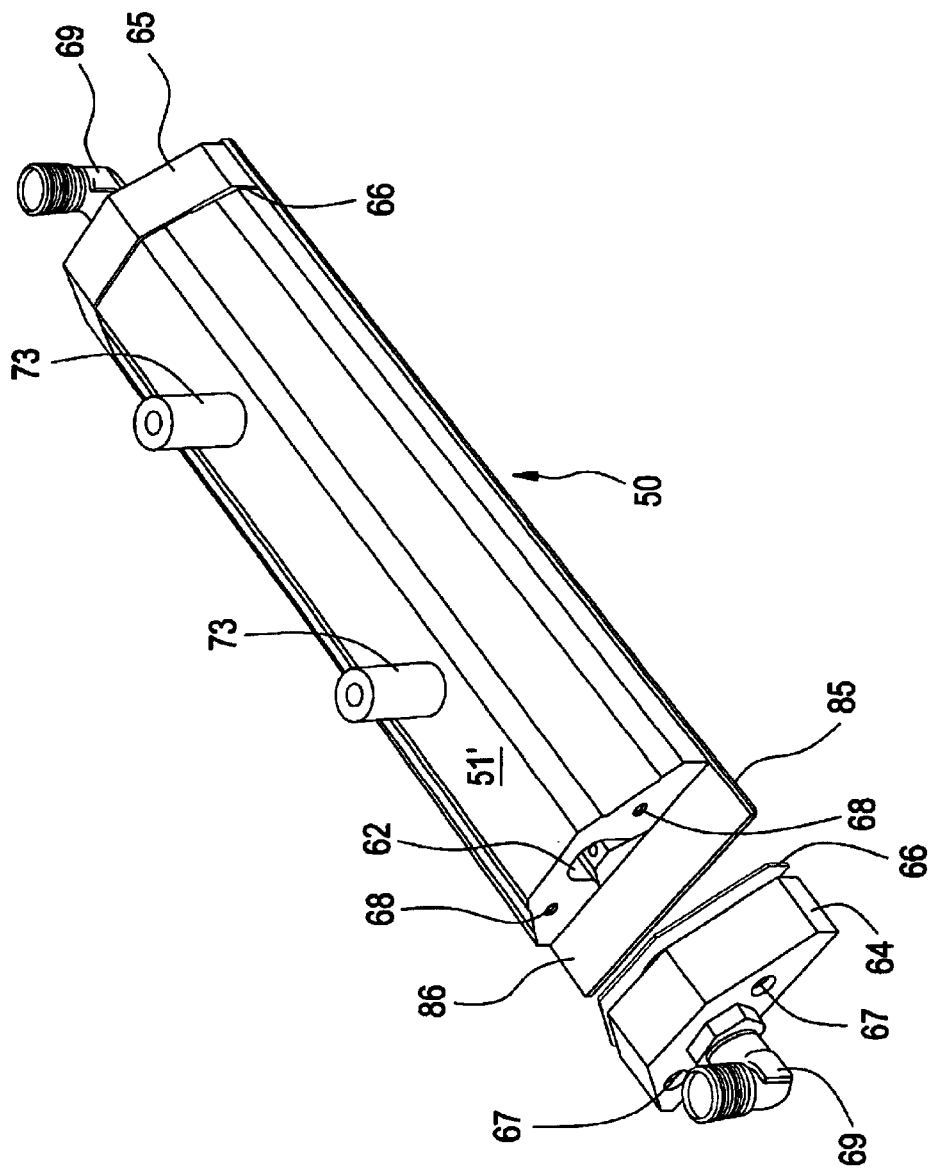
FIG. 19 is a perspective view from above, and partly an exploded view, of a preferred embodiment of applicator device according to the invention.
Figure 20:
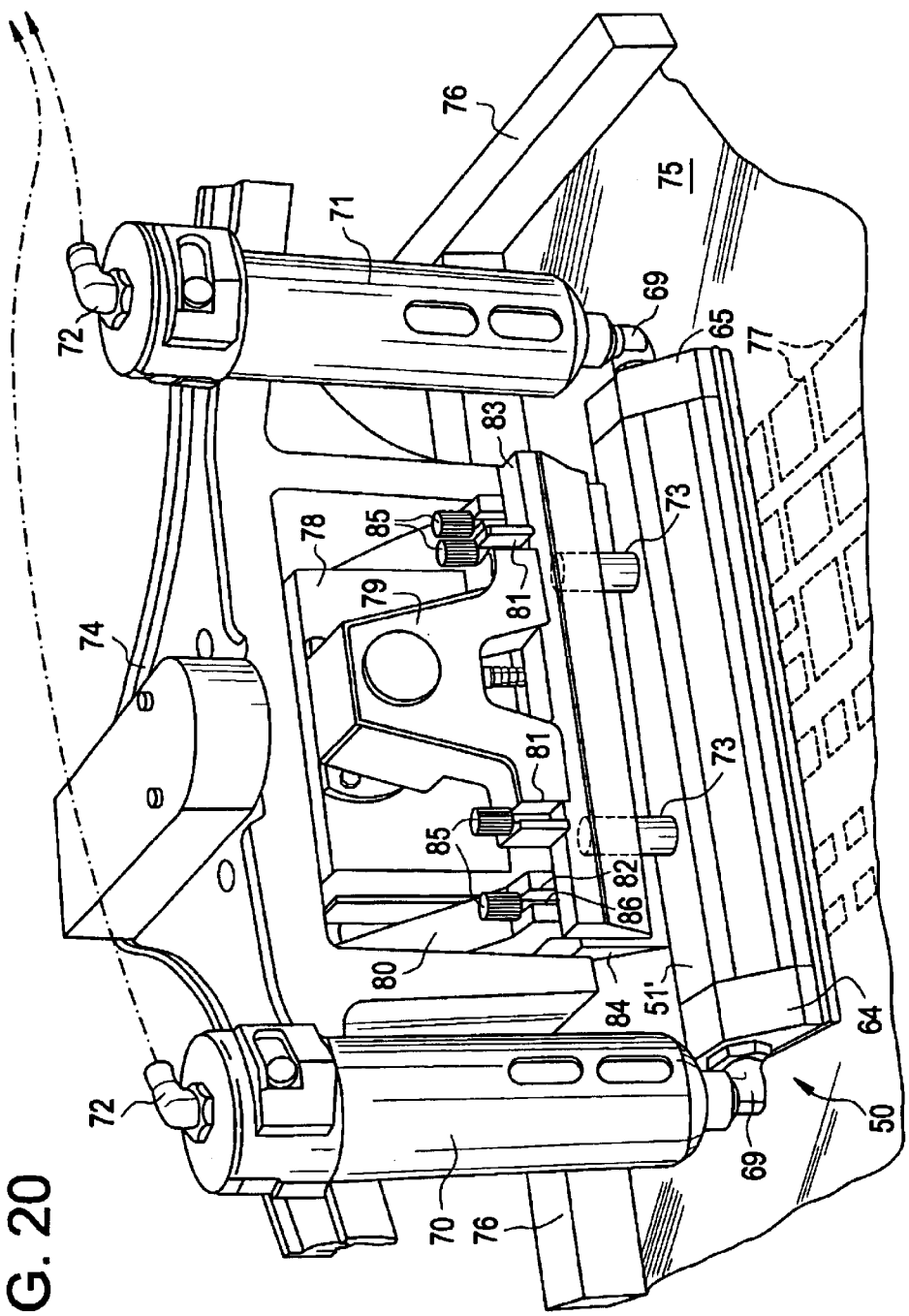
FIG. 20 is a perspective view of the device of FIG. 19 having two supply cartridges attached and mounted on a known stencil printing machine by means of special mounting plates or adapters according to the invention.

FIG. 18 is a schematic plan from below of an applicator device similar to that of FIGS. 13 to 16 but wherein instead of through passages 23, 23' in the sloping side walls of the retainer member 6, member 6 is provided with a flat top surface, instead of the apex as shown in FIGS. 1–16, and a plurality of through passages 44 (equivalent to passages 23') for the flow of fluid medium and has overlying such an elongate foil (not shown) with smaller pressure reducing/flow restricting apertures therein and aligned with apertures 44 is provided and clamped in position to overlie aperture 44.

Figure 17:
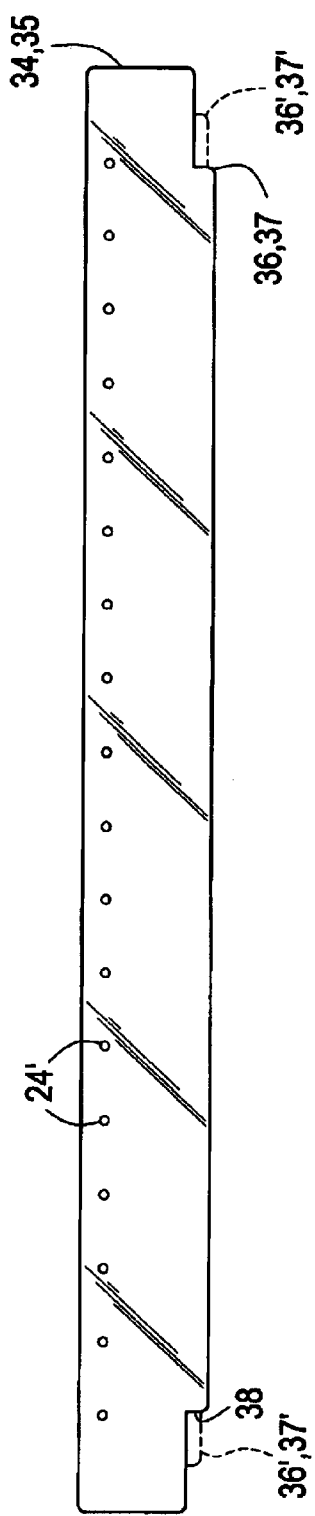
FIG. 17 is a plan of one of the two lateral retaining foils which hold the applicator foil part of FIG. 16 in position and prior to bending of the lowermost edge along a score/partially etched line.

A modified foil member 33M is provided and abuts a resilient O-ring in a groove (40) in similar manner to that of FIGS. 13–16 and is held in place by retaining foils similar to foils 34, 35 at FIG. 17 but foil retaining detents 45 are provided for engagement with the regions adjacent shoulders by fold lines 38 to retaining edges 36,37.

The amount retaining edges 36, 37 extend from member 6 is determined by smaller edge flaps 46, separated by fold lines as indicated by broken line 36', 37' in FIG. 17 and differently sized foils can be provided.

Instead of end spacing blocks 42 as illustrated in FIG. 13, the whole of the paste outlet aperture in the bottom of the applicator device of FIG. 18 is surrounded by a spacing member or shoe 46 which in the example is a one piece member of requisite spacing thickness and is preferably PTFE to minimize wear and provide lubrication effect. Screw holes 48 are provided for securement. The surrounding spacing member enables stencils and substrates of a shorter length with shorter aperture foils 33M without loss of paste.

In a screen printing apparatus, once the apparatus of the invention is located under the pressure members and one of such has been applied to the apparatus of the invention, then such together with the whole of the stencil are lowered on to a board/substrate positioned therebeneath, prior to the application of paste and it is in accordance with the present invention that a screen printing apparatus may be provided with, or modified so that, a pressure switch, such as a microswitch, detects when such lowering takes place and issues a signal to the pneumatic control of the apparatus of the invention to switch over the pressurisation from one cartridge to the other etc. and release pressure from the pressurised cartridge.

It is to be appreciated that the present invention enables an existing squeegee blade operating printing machine to be modified by removal of the squeegee blades and the application of two adapter blades with central location means and then the simple disposition of the present apparatus under the pressure arms and blades thereon and with the provision of a pneumatic control circuit and the mentioned pressure switch, the adaption can be effected very simply and effective and economically. The machine can readily be re-converted to use with existing squeegees by reversal of the process.

It is desirable to store solder paste at low temperature such as in a refrigerator, and during downtime, after use, for example, the apparatus of the invention may be simply removed from under the adapter's blades 12,13 and a sealing retaining strip or other means secured over the lowermost aperture 19 to close such or the aperture may be sealed with self-adhesive tape and then stored in a refrigerator until next required for use.

To give some idea of the volumes of paste media or other fluid involved, for an average stencil for solder paste printing, the operative area may have some two thousand apertures through which paste is to be deposited and with an average size of say 1.5 mm by 0.5 mm and a thickness of 0.15 mm, the volume of paste to be deposited during each stencilling operation/stroke of the machine some 225 cubic millimeters would actually be required for the stencilling. However, in apparatus according to the invention some 1,225 cubic millimeters of paste is caused to move with each stroke of the machine and thus movement of some five times the amount of paste actually required for stencilling takes place and therefor the rheology is improved five-fold.

In FIGS. 19–28 and FIGS. 29–36 the preferred embodiment of the invention is illustrated and comprises an applicator device 50 made up of a main part of a print-head or body 51 formed as an aluminium extrusion and having a pressure reduction and mounting means 52 for mounting of a resilient O-ring 53 in a groove 54 in the lower side and for mounting a sealing gasket 55 formed of thin flexible and resilient steel sheet/foil in elongate channels or grooves 56 along each side. The pressure reduction and mounting means 52 is secured by two bolts 57 which extend through apertures 58 (and through apertures 59 in auxiliary pressure reduction plate 60, when provided, —FIG. 28—having smaller apertures 61 aligned with apertures 52 and for use with less viscous fluids).

There is thus provided in the cross-head applicator device 50 a higher fluid pressure chamber or duct 62 on a lower pressure chamber or duct 63 each running substantially the length of the device 50.

Two end inlet and cartridge connection means or manifolds 64,65 with sealing gaskets 66 are secured by screws (not shown) in apertures 67,68 to each end of body 51 and have passages (not shown) communicating with higher pressure duct 62 and with a coupling pipe 69 to which fluid reservoirs or cartridges 70,71 may be connected by screwing thereto or by other quick coupling means, if desired. The cartridges 70,71 are known items and the fluid may be discharged therefrom under pressure by pneumatic action via pipelines coupled at 72 and coupled to control means— see arrow indications—operating in synchronism with the movements of the screen printing machine of which only the displacing means are illustrated. A piston (not shown) is provided in each cartridge 70,71 to drive fluid from the cartridge when desired. Preferably fluid will be alternately discharged from the cartridges 70,71 during strokes or movements of the screen printing machine with more fluid being discharged during each stroke than is needed to be deposited through the stencil and this is achieved by enabling some fluid to flow back into the unpressurised cartridge and vice versa. This extra fluid flow improves the characteristics of the fluid especially when such is solder paste, Because significant pressure is required for the discharge from a cartridge 70,71 and into the other cartridge, and more than is necessary for the stencilling operation, a pressure reduction is enabled by the apertures 52' or 61 when provided.

The bolts 57 which clamp the pressure reduction and mounting means 52 to body 51 also secure two plastics or metal coupling cylinders 73 to the top of body 51. In known solder paste screen printing machines as used in the electronics industry and to which the applicator device 50 of the invention may be readily connected, a displaceable carriage 74 is reciprocably driven over a metal stencil 75 tensioned between a frame 76 and beneath which stencil there is located during each stroke of the carriage 74 a substrate (not shown) by means of a reciprocably lower carriage (not shown) and which is to have solder paste applied thereto in accordance with the apertures 77 in the stencil. In the known machines, a vertical reciprocating mechanism 78 is provided having two yokes 79,80 to each of which, hitherto, a so called "squeegee" blade (not shown) was attached via threaded members and nuts in channels 81,82. These squeegees during each pass or stroke of the machine are alternately raised or lowered depending as to whether it was to slide along the stencil surface driving/rolling a bead of solder paste in front of it. The present invention most advantageously enables existing machines to be readily adapted to use the applicator device of the invention or any other suitable device with very little modification of the existing machine and by simply disconnecting the known squeegee blades from the channels 81,82 of the carriages 79,80 and replacing such with adapter blades 83,84 secured by internally threaded knurled caps 85 on threaded rods 86 extending from the top surfaces of adapter blades 83,84. The blades 83,84 reduce in section to the lower ends and alternately bear on the top surface 51 of body 51 either side of cylinders 73 but at all times in sliding abutting relationship—with opposite sides of cylinders retained 73 in small receiving/retaining recesses (not shown) for parts of cylinders 73 being provided in the opposite faces of the adapter blades 83,84 so as to also locate the device 50 against any undesired lateral or axial displacement. Thus the device of the invention is readily retained and displaced by being securely located or clamped in between the blades 83,84 which may slide vertically relative to cylinders 73 and the applicator device is thus driven horizontally in the existing machine drive. It is considered the adapter arrangement also provides an independent inventive aspect according to the invention. To accommodate for the alternate lifting off of each blade 83,84, spring means (not shown) may be provided so as to always maintain pressure on both sides of the applicator device to avoid any undesired pressure reduction or tilting effect on one side.

Returning now to describe more fully a most important inventive aspect of the interface between the applicator device 50 and the stencil 75 and in particular the nature of the sealing means or sealing gasket 55, a "shoe" at spacing member 85 of approx. 3 mm thickness is provided of PTFE so as to readily slide in the stencil and is backed by a stiffening or strengthening metal plate 86—especially of importance if the spacing member 85 extends beyond the end of the body 51. Both shoe member 85 and plate 86 have the same outline and define a central rectangular aperture 85' and 86' within which gasket 55 lies and are secured via twelve apertures each to threaded apertures 87 in body 51 by screws 88 whose heads lie in countersunk recesses so as not to extend beneath the member 85.

Figure 25:
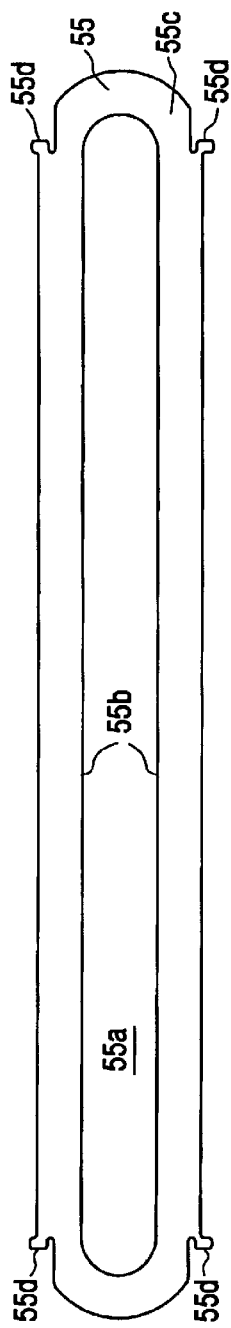
FIG. 25 is a plan of a sealing gasket or sealing means with a single, elongate rounded-end central aperture.
Figure 26:
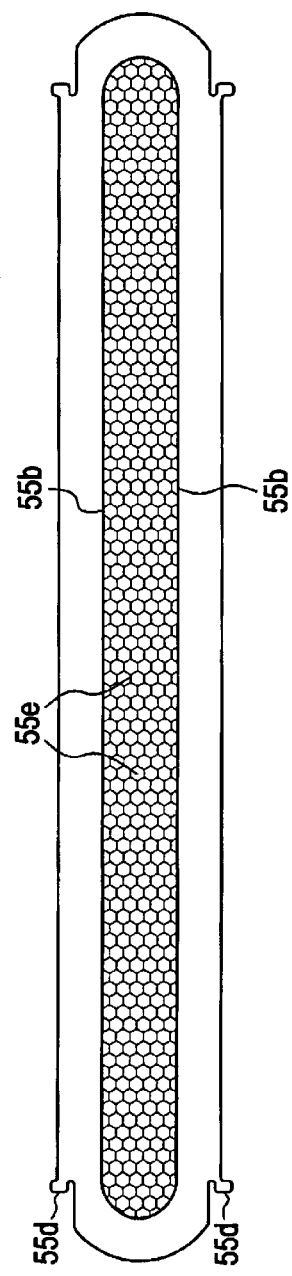
FIG. 26 is a plan of a gasket similar to that of FIG. 25 except there is mesh-like central part in which a plurality of apertures are provided as an alternative fluid exit control.
Figure 27:
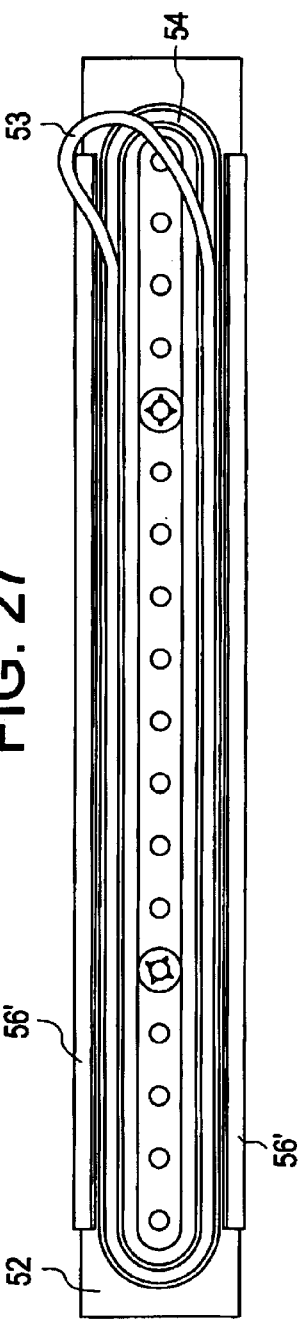
FIG. 27 is a plan from below of the pressure reducing and mounting member showing a resilient O-ring in position but partially lifted out at the right-hand end.
Figure 33:
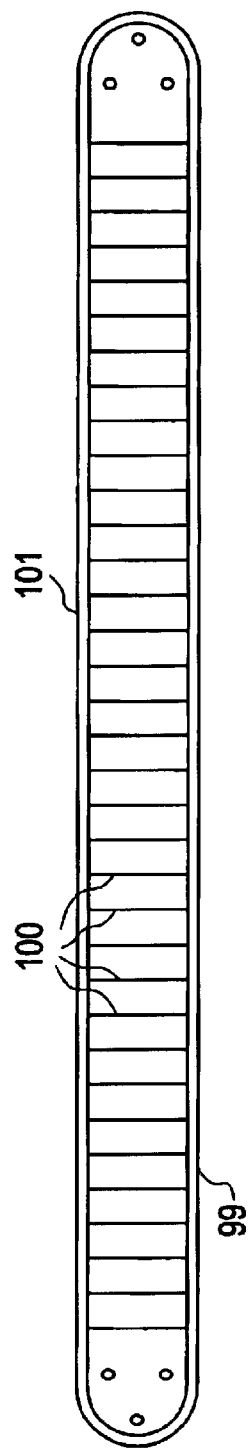
FIG. 33 is a plan from below of a blanking-off strip with part transverse etching lines for snapping off two and blanking-off strips to size.

The sealing member or sealing gasket 55 as shown in FIG. 25 is comprised of a thin flexible and resilient sheet of steel having an elongate central aperture 55a with straight sides and inner edges 55b and rounded ends 55c and has detents 55d which act to locate the gasket by stopping against the end of walls 56' which partly define grooves 56. In FIG. 26 instead of a single aperture as outlet passage as in FIG. 25, a honeycombe-like mesh 55e defining a plurality of apertures is shown for different applicators.

Walls 56' do not extend beneath the lower surface of sliding spacing member 85. Inclined channels 89 are provided in the lower surface of member 85 for disposal of any inadvertent leak of fluid.

The thickness of the spacing member 85 and the shape and size and disposition of the sealing member 55 and its securement and the size and location of the O-ring 53 are selected so that the inner edges 55b of the gasket (which also extend around the rounded ends) are flexed and project slightly beneath the plane of the spacing member 85 (see FIG. 24) when not placed on a support surface, and to an extent such that when placed on a planar support surface, the gasket 55 is forced upwardly against the O-ring 53 and its own resilience so as to cause a sealing action by the flat portion surface against the stencil surface. It will be appreciated that the sealing action is a physical provision by virtue of the construction etc., and not dependent on the fluid pressure. The O-ring 53 acts against the upper continuous peripheral portion of the sealing gasket to force the lower continuous peripheral portion of the gasket against the stencil surface and, in use, the inner portions of the continuous peripheral portion defining edges 55b,55c will be in a substantially horizontal plane i.e. the plane in which the lower face of sealing member 55 lies.

In FIG. 23 a clear plastics "keeper block" is illustrated which may be located over the bottom of the device 50 when it is desired to prime or load the head—a closeable air vent V being provided to enable air to escape since the seal is so good. Two further apertures are also provided for securing the block against the shoe and gasket by screw means (not shown). The block can be used for storing the applicator when charged with paste—hole V being closed.

There will now be described modifications wherein blanking-off plates are provided to enable the applicator device to be used on substrates of less width than the device 50 and also the formation of the sealing gasket or sealing member instead of as a planar member but with pre-formed inclined side walls and part-conical opposite end portions for improved sealing effect.

It has been found that the sealing means or sealing gasket having rounded continuous peripheral portions at opposite ends of an elongate aperture which is planar in its normal unmounted condition, can be substantially improved if the rounded ends are pre-formed or pre-shaped each as a part or half-conical surface which results in a very good sealing effect with the rounded ends of the O-rings and the stencil.

In FIG. 29 the sealing gasket 55 is illustrated in flat form as a "development" and can be manufactured from such flat form and this is a stage in the eventual gasket manufacture where the sheet metal is etched to such shape of FIG. 29 and lies flat with one elongate side being divided into two portions 90,91 inclined relative to each other and the other side 92, with the opposite sides of opposite end regions 93,94 being half-etched so that they may overlie in abutting interrelationship so as to have the total thickness of the sheet of the material from which the gasket is made and then may be secured 95 in such manner by spot welding and/or adhesive (and possibly with additional tie plates added if required) and the resultant of sealing gasket is as illustrated in FIG. 30 wherein prior to this the member is bowed in its free form but here the outer edges of the long sides have been disposed parallel and in the same plane and the sides will have inclined surfaces (in use converging inwardly and downwardly) and, whilst it is neither clearly shown, the opposite curved end portions 96 are part-conically inclined surfaces. In the first described arrangement, two joined side portions may be provided as a lap joint and bonded by spot welding and/or adhesive together with other means 95 if required. This pre-forming or pre-stressing with inclined sides and part conical ends of the gasket provides for an exceptional good sealing effect at the ends and in fact continuously all round.

Figure 31:
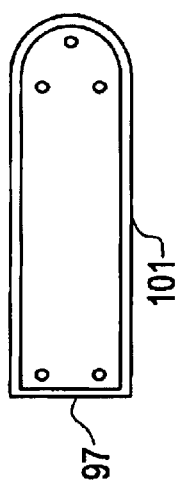
FIGS. 31 and 32 are plan views from below of one each of two a pairs of "blanking-off" plates to be used for shortening the effective application width of the applicator device when to be used on a substrate of width narrower than the applicator device.
Figure 32:
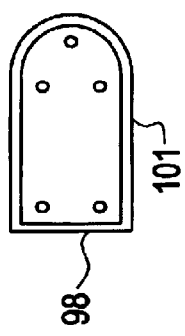
Figure 34:
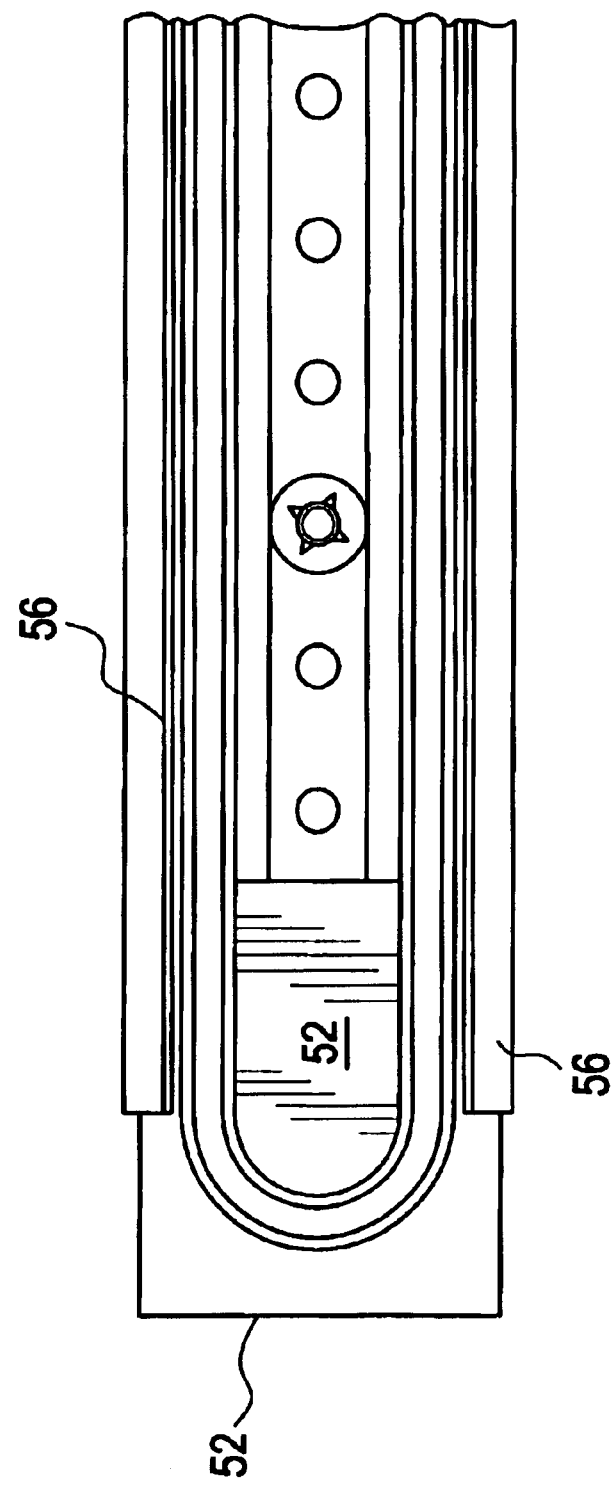
FIG. 34 is a schematic illustration showing the location of a blanking-off strip.

In the previous description reference has been made to a possibility of modifying and shortening the effective application width of the applicator device by replacing the pressure reduction and mounting member 52 with a shorter member and shorter O-ring 53 and a shorter sealing gasket 55 although a simpler possibility is now proposed in FIGS. 31 to 35 wherein blanking-off parts 97,98,99 may be located at opposite end regions of the lowermost aperture and sealingly held between the O-ring 53 and the continuous portion of the sealing gasket 55 and two of such blanking-off ends are shown in FIGS. 31 and 32 being of different lengths—one of each identical blanks being located at opposite ends and retained in position such as part 98 illustrated at one end in FIG. 34. In FIG. 35, a blanking-off part 97/98 is shown in section having a guide or locating member 102 (of say 0.1 mm) spot welded thereto (such as via small holes illustrated in FIGS. 31 to 33) which has rounded ends and locates between the inner faces of the walls defining the groove 54 and positions the lower edge of part 97/98 resting on the O-ring 53 inwardly of and above the lowermost surface of the O-ring 53 and above the scraping/wiping inner edge 103 of the sealing gasket 55 such that when gasket 55 is flexed upwardly on contacting a stencil therebeneath to move into a horizontal or substantially horizontal plane, the edges abut and fie in the half-etched edges 101 to present a flush surface with the rest at the lower face of part 97/98.

It is also envisaged to provide for the user to select the requisite blanking-off length of part by providing continuous metal strip 99 with semi etched/scored lines 100 at say 5 mm spacing so as to enable the length of the blanking-off sections to be determined by the user by simply breaking off the appropriate lengths. Around the outermost peripheral edges and the rounded end edges of the blanking-off sheets such are half-etched at 101 so as to fit closely between the O-ring and the continuous peripheral portion without any deformation of the latter and provides a smooth flat or substantially flat flush surface with the continuous peripheral portion in use. For example the blanking-off sheet may be 0.2 mm and half-etched to 0.1 mm to use with a gasket of 0.1 mm so that when the gasket is pressed flat so that its actually a flat surface results (see drawing).

In previous embodiments it has been suggested that the aperture defined within the continuous peripheral portion of the sealing gasket might be of different shape and a plurality of apertures, as desired, by forming the gasket appropriately. However, as an alternative, it is envisaged that in a manner similar to location of the blanking-off strips 97,98, there may be located in the elongate aperture, an apertured mesh member of perhaps double the thickness of the sheet of the sealing gasket and half-etched around the periphery to provide a similar flush surface as at the end blanking-off strips 97,98. Thus the two components would form the lowermost apertures to the device.

Figure 21:
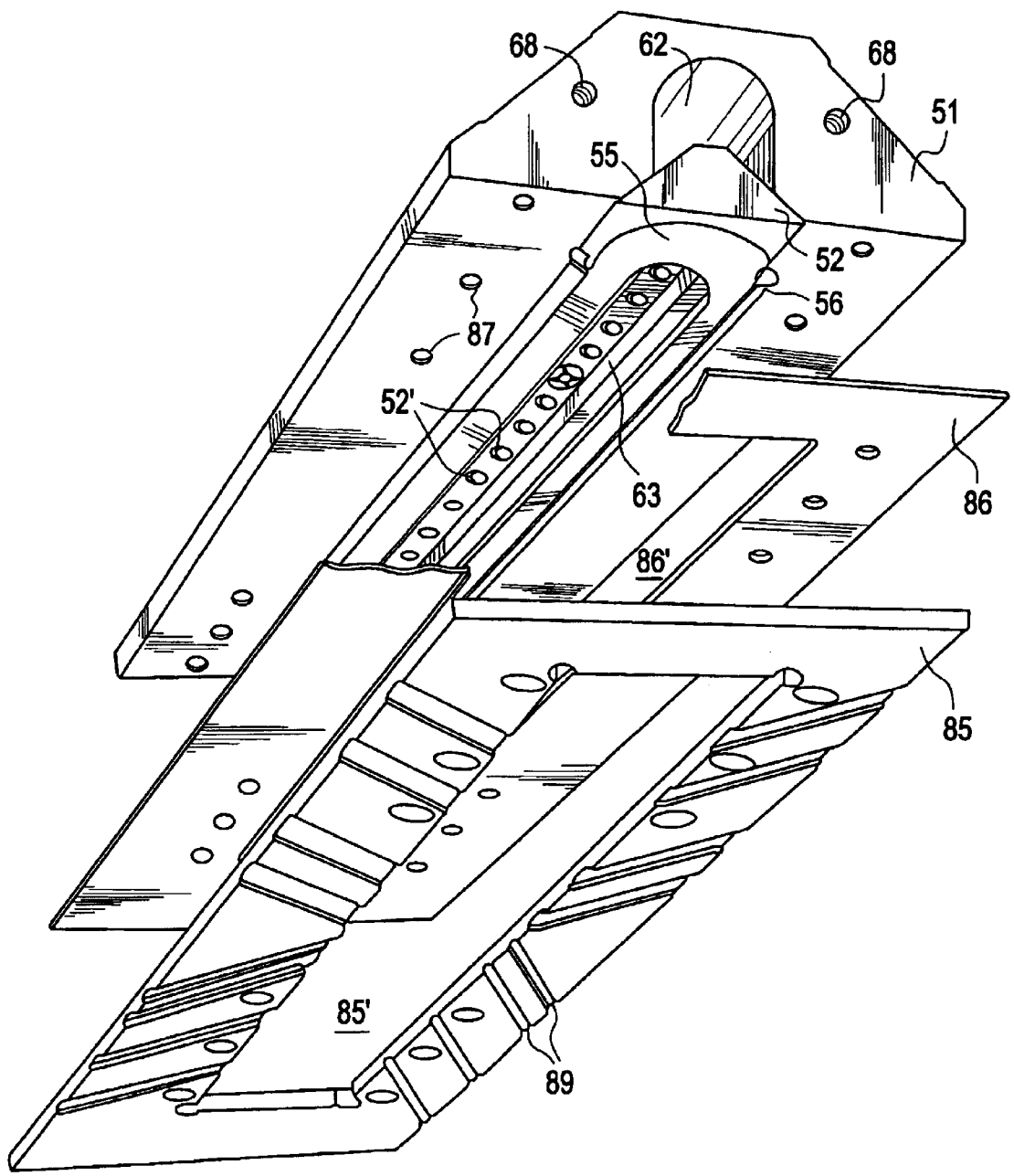
FIG. 21 is an exploded perspective view from below of the device of FIG. 19 showing an upper housing or body member with pressure-reduction and mounting means positioned in the ducting means and also showing a rigid metal backing plate for a rectangular spacing member or shoe defining a rectangular aperture.
Figure 24:
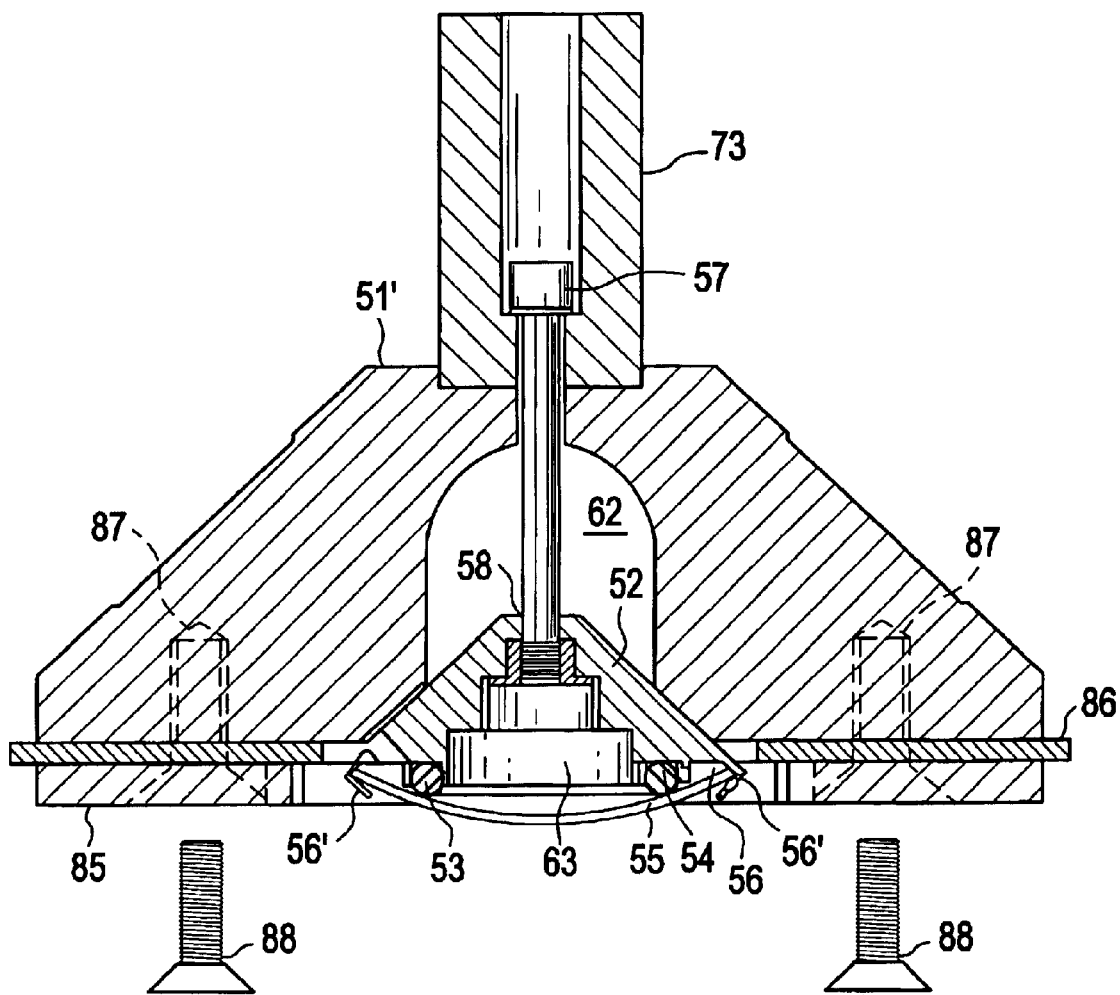
FIG. 24 is a section on the line X—X of FIG. 22.

In FIGS. 36 and 37 there is illustrated an improved construction wherein instead of the print head body 51 and separate mounting and pressure-reduction means 52 of FIG. 21 etc., the body 103 is integrally formed as an extrusion with a main flow passage 62' with converging lower side walls 104 somewhat in the shape of an inverted tear drop and then the lower reduced pressure flow passage 63' is machined into the extrusion as shown in broken line 106 in FIG. 36 about a vertical central plane indicated by broken line 107. It will be appreciated that the more the reduced pressure-flow passage 63' is machined into the main flow passage 62' to form a pressure reduction slot S the greater will be the width of said slot S and hence the lesser the pressure reduction. The slot S may be of constant width or, if the depth of machining is varied along the longitudinal axis, the width can be changed. For example, there may be a narrower width at opposite ends in the region of the paste inlet from the reservoir and such may each enlarge, e.g. by way of a taper or divergence to be widest in the middle of the length so as to optimize the distribution of paste along the length of the reduced pressure flow passage 63'.

In FIG. 36 the sealing gasket 55 and O-ring 53 and groove 54 will be as described before but instead of walls 56', the gasket 55 will be held by inclined edge walls of a plate member 110 which has a central elongate aperture and angled defining walls 110' including the inclined wall for receiving the opposite edges of gasket 53 and will be clamped by plate 86 and shoe 85 (not shown) which will be modified in shape as necessary.

FIG. 37 is an end elevation of a modified body 108 extrusion with different shape and does not show the formation of the reduced pressure flow passage 63' which would cut into passage 62'. The extrusion 108 mainly differs by formation of cavities 109 at either side for material saving purposes.

It is to be understood that the pressure reduction means, such as 20/24, 23/24, 23'/24', 44,52'/61 and S, act as a flow restriction means to temporarily reduce the pressure in the paste during a printing operation when it is flowing out of the bottom of the device and through the stencil. Of course, with the pressure reduction means being in the form of flow restriction apertures or a slot, if no paste is removed, pressure in the main flow passage and the dispensing aperture would eventually equalize.

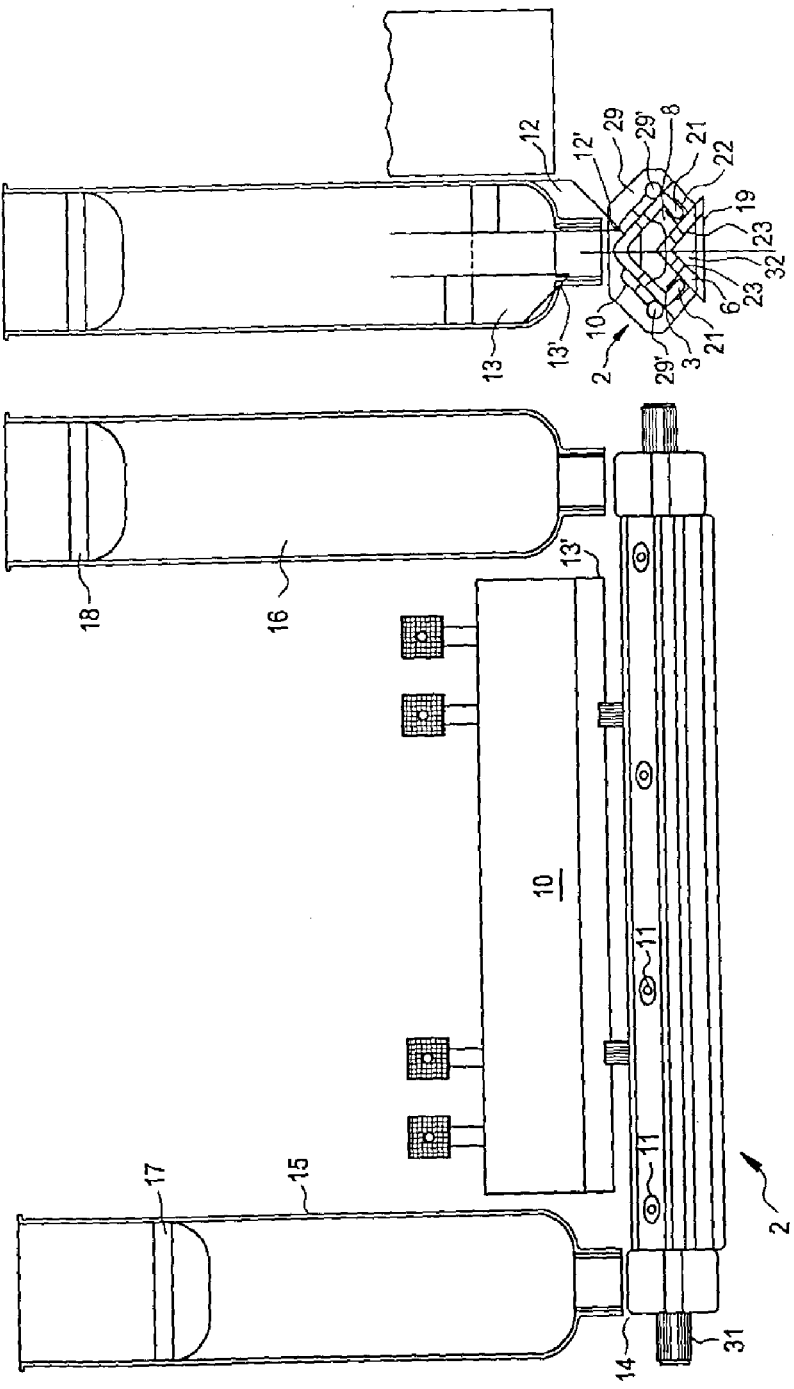

What is claimed is:

1. An application device for use in a stencil printing machine, which includes a carriage for executing reciprocable strokes, to apply a fluid material to a surface of a stencil including a plurality of apertures and through the apertures onto a substrate disposed therebeneath, the device comprising:

a main body slideably disposed along the surface of the stencil and including a main flow passage, and at least one outlet aperture in a lowermost surface thereof through which fluid material is in use delivered, the at least one outlet aperture being in fluid communication with the main flow passage and in use in sealing contact with the stencil;

at least one fluid material reservoir in fluid communication with the main flow passage; and displacement means operable, during each stroke of the stencil printing machine, to displace an amount of fluid material from the at least one fluid material reservoir through the main flow passage which is greater than that delivered through the at least one outlet aperture.

2. The device as claimed in claim 1, further comprising:

pressure reduction means disposed upstream of the at least one outlet aperture.

3. The device as claimed in claim 2, wherein the pressure reduction means is disposed between the main flow passage and the at least one outlet aperture.

4. The device as claimed in claim 2, wherein the pressure reduction means is such as to produce a significant reduction of pressure in the order of a ratio of 6 to 1.

5. The device as claimed in claim 2, wherein the pressure reduction means comprises a flow restrictor.

6. The device as claimed in claim 5, wherein the flow restrictor comprises a partition including one or more apertures.

7. The device as claimed in claim 1, wherein the fluid material is a viscous material.

8. The device as claimed in claim 7, wherein the viscous material comprises a paste.

9. A screen printing apparatus adapted or modified to incorporate the device as claimed in claim 1 and having pneumatic control.

10. An application device for use in a stencil printing machine to apply a fluid material through apertures in a stencil and onto a substrate disposed beneath the stencil, the device comprising:

a main body slideably disposed in fluid-retaining relationship with an upper surface of the stencil, and including a main flow passage along which fluid material is displaceable, and at least one outlet aperture in a lowermost surface thereof through which fluid material is in use delivered to the substrate, the at least one outlet aperture being in fluid communication with the main flow passage and in use in sealing contact with the stencil;

at least one fluid material reservoir in fluid communication with the main flow passage; and pressure-exerting means for exerting a pressure to the fluid material at at least one end of the main flow passage and thereby displace an amount of fluid material from the at least one fluid material reservoir through the main flow passage which is greater than that delivered through the at least one outlet aperture.

11. The device as claimed in claim 10, wherein the pressure-exerting means is configured to provide a continuous flow.

12. The device as claimed in claim 10, wherein the pressure-exerting means is configured to provide an intermittent flow.

13. The device as claimed in claim 10, wherein the pressure-exerting means is configured to apply a pressure to one end of the main flow passage such as to cause fluid material to be displaced in one direction therethrough on operation of the pressure-exerting means.

14. The device as claimed in claim 13, further comprising:

accommodation means for accommodating fluid material displaced through the main flow passage on application of the pressure-exerting means which is additional to the fluid material delivered through the at least one outlet aperture.

15. The device as claimed in claim 10, wherein the pressure-exerting means is configured to apply a pressure to respective ones of the ends of the main flow passage such as to enable fluid material to be displaced in opposed directions therethrough on operation of the pressure-exerting means.

16. The device as claimed in claim 15, wherein the pressure-exerting means is configured to apply a pressure alternately to respective ones of the ends of the main flow passage such as to enable fluid material to be displaced alternately in opposed directions therethrough on operation of the pressure-exerting means.

17. The device as claimed in claim 15, wherein the pressure-exerting means comprises first and second reservoirs disposed at opposed ends of the main flow passage such that fluid material delivered from one of the reservoirs to the main flow passage and not delivered through the at least one outlet opening is received by the other of the reservoirs.

18. The device as claimed in claim 16, wherein the pressure-exerting means comprises first and second reservoirs disposed at opposed ends of the main flow passage such that fluid material delivered from one of the reservoirs to the main flow passage and not delivered through the at least one outlet opening is received by the other of the reservoirs.

19. The device as claimed in claim 18, wherein the reservoirs comprise cartridges as piston-cylinder arrangements, with the pistons being alternately displaceable during each stroke of the stencil printing machine such as to drive fluid material in opposite directions through the main flow passage and thereby provide for movement of a bulk of the fluid material during printing.

20. The device as claimed in claim 10, wherein the lowermost surface of the main body is substantially planar and the device is such as to enable first and second pressure members of the stencil printing machine to be urgeable against receiving means on an upwardly-facing side of the device, whereby the lowermost surface of the main body is in use urged against the upper surface of the stencil, and the pressure members alternate in application such as to be on a downstream side of the device with respect to the direction of movement of the device and above a sealing edge of the at least one outlet aperture.

21. The device as claimed in claim 10, wherein the at least one outlet aperture comprises an elongate slot.

22. The device as claimed in claim 10, wherein the at least one outlet aperture is multi-apertured.

23. The device as claimed in claim 22, wherein the at least one outlet aperture is one of a grill or mesh.

24. The device as claimed in claim 10, further comprising:

a sealing member which defines the at least one outlet aperture, the sealing member comprising a flexible sheet having a continuous, non-apertured outer region.

25. The device as claimed in claim 24, wherein the main body includes channels in which the flexible sheet is retained.

26. The device as claimed in claim 24, wherein the main body includes a groove, and the sealing member further comprises a resilient element disposed in the groove to urge the flexible sheet downwardly when the flexible sheet is displaced upwardly by the action of the stencil.

27. The device as claimed in claim 24, wherein the flexible sheet comprises a foil.

28. The device as claimed in claim 10, wherein the main flow passage includes a converging wall portion leading to a slot having a width and shape configured such as to provide one or both of a desired pressure reduction and fluid distribution to the at least one outlet aperture.

29. The device as claimed in claim 10, wherein the fluid material is a viscous material.

30. The device as claimed in claim 29, wherein the viscous material comprises a paste.

31. A screen printing apparatus adapted or modified to incorporate the device as claimed in claim 10 and having pneumatic control.

* * * * *

UNITED STATES PATENT AND TRADEMARK OFFICE
CERTIFICATE OF CORRECTION

PATENT NO. : 6,725,769 B1
DATED : April 27, 2004
INVENTOR(S) : David Godfrey Williams It is certified that error appears in the above-identified patent and that said Letters Patent is hereby corrected as shown below:

Drawings,
Please replace sheet 1 of 25 with the drawing sheet attached hereto.

Signed and Sealed this

Ninth Day of November, 2004

JON W. DUDAS
*Director of the United States Patent and Trademark Office*